United States Patent
Zhu et al.

(10) Patent No.: US 7,442,585 B2
(45) Date of Patent: Oct. 28, 2008

(54) MOSFET WITH LATERALLY GRADED CHANNEL REGION AND METHOD FOR MANUFACTURING SAME

(75) Inventors: Huilong Zhu, Poughkeepsie, NY (US); Xiangdong Chen, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 11/162,126

(22) Filed: Aug. 30, 2005

(65) Prior Publication Data

US 2007/0045611 A1    Mar. 1, 2007

(51) Int. Cl.
*H01L 21/00* (2006.01)
(52) U.S. Cl. .................. 438/149; 438/479; 438/517; 257/E21.561; 257/E21.57; 257/E21.704

(58) Field of Classification Search .................. 438/149, 438/479, 517; 257/E21.561, E21.57, E21.704
See application file for complete search history.

(56) References Cited

U.S. PATENT DOCUMENTS

| | | |
|---|---|---|
| 5,777,364 A | 7/1998 | Crabbe et al. |
| 6,004,137 A | 12/1999 | Crabbe et al. |

*Primary Examiner*—Lynne A. Gurley
*Assistant Examiner*—Samuel A Gebremariam
(74) *Attorney, Agent, or Firm*—Scully, Scott, Murphy & Presser, P.C.; H. Daniel Schnurmann

(57) ABSTRACT

The present invention relates generally to a semiconductor device having a channel region comprising a semiconductor alloy of a first semiconductor material and a second, different material, and wherein atomic distribution of the second material in the channel region is graded along a direction that is substantially parallel to a substrate surface in which the semiconductor device is located. Specifically, the semiconductor device comprises a field effect transistor (FET) that has a SiGe channel with a laterally graded germanium content.

7 Claims, 16 Drawing Sheets

MOSFET WITH LATERALLY GRADED CHANNEL REGION AND METHOD FOR MANUFACTURING SAME

FIELD OF THE INVENTION

The present invention relates to semiconductor devices with improved performance and methods for fabricating the same. More specifically, the present invention relates to metal-oxide-semiconductor field effect transistors (MOSFETs) that have laterally graded SiGe channels constructed and arranged for carrier mobility enhancement, and methods for fabricating such MOSFETs.

BACKGROUND OF THE INVENTION

One of the key challenges in scaling MOSFET devices down to 25 nm is to improve the drive current without degradation of the short channel performance and off-gate leakage current. Specifically, in sub-100 nm MOSFET devices, the deleterious impact of short channel and hot carrier effects becomes more severe, due to reduction in gate length. Therefore, doping in the channel region (e.g., halo doping) must be increased in order to suppress the short channel and hot carrier effects. The increased channel doping nevertheless leads to degradation in carrier mobility, which in turn reduces the drive current in the channel region. Improvement in the drive current is therefore limited.

U.S. Pat. No. 5,777,364 issued on Jul. 7, 1998 entitled "Graded Channel Field Effect Transistor" describes a metal-insulator-semiconductor field effect transistor (MISFET) with a SiGe channel region having a vertically germanium content gradient. An example of the MISFET, as disclosed by this patent, is shown in FIG. 1 (see reference numeral 110), which is formed in an upper surface of a silicon substrate 112 and contains a narrow in situ doped silicon layer 114, a narrow undoped silicon spacer 116, an undoped SiGe channel layer 118, a silicon cap layer 120, a gate insulator layer 122, and a gate electrode layer 124. The source and drain regions 126 and 128 of the MISFET 110 are formed by implantation or out-diffusion, defining a channel region 127 therebetween. Contacts 130, 132 and 134 are formed on the source, drain, and gate regions to complete the device. The percentage of germanium in the SiGe channel layer 118 is graded along the vertical direction, i.e., the direction perpendicular to the substrate surface, to form a single peak percentage level. Electric current flows between the source and drain regions 126 and 128 along a lateral direction, i.e., the direction parallel to the substrate surface, through the channel region 127. The vertical gradient of the germanium content in the SiGe channel layer 118 therefore provides a built-in electric field along the vertical direction and functions to confine the carriers to a desired vertical location in the channel layer, without little or no parasitic flow of carriers at the insulator/channel interface or at the spacer/channel interface. In this manner, the transconductance of the MISFET device 110 is improved in comparison with devices having only un-graded SiGe channels.

However, the MISFET device disclosed by U.S. Pat. No. 5,777,364 only provides means for passively confining the carriers to a desired vertical location in the channel region, which does not in any manner improve the effective mobility of the carriers along the lateral source/drain direction or the current flow direction.

There is therefore a need for increasing the effective carrier mobility in the channel regions of the sub-100 nm MOSFET devices along the source/drain direction or the current flow direction, without otherwise degrading the performance of the MOSFET devices.

SUMMARY OF THE INVENTION

The present invention seeks to further improve performance of currently available MOSFET devices by providing a desired quasi-static drift field in a channel region of an MOSFET device with decreasing band-gap along the direction of the current flow, so as to accelerate the current flow in the channel region.

More specifically, the present invention provides a method for fabricating an MOSFET device with a channel region that is characterized by a compositional gradient along the lateral direction, i.e., the direction that is substantially parallel to the substrate surface. Such a compositional gradient establishes a desired quasi-static drift field in the channel region with decreasing band-gap along the direction of the current flow in the channel region.

In one aspect, the present invention relates to a semiconductor device, which comprises:

a semiconductor substrate having a substrate surface;

a source region located in the substrate surface;

a drain region located in the substrate surface and spaced apart from the source region;

a channel region located in the substrate surface between the source and drain region; and a gate structure located over the channel region, the gate structure comprising a gate dielectric layer and a gate electrode, wherein the channel region comprises a semiconductor alloy comprising a first material and a second, different material, and wherein concentration of the second material is graded in the channel region along a direction that is substantially parallel to said substrate surface.

The semiconductor substrate may be either a semiconductor-on-insulator structure, or a bulk semiconductor structure. Further, the semiconductor device may be either an n-channel field effect transistor (n-FET), or a p-channel field effect transistor (p-FET), or a combination of both.

Preferably, the source, drain, and channel region define a current flow direction that is substantially parallel to the substrate surface, and the concentration of the second material in the channel region is graded along the current flow direction.

Preferably, the first and second materials in the channel region are selected from the group consisting of Si, Ge, C, Ga, As, In, Al, Sb, B, Pb, and combinations thereof, as long as the first and second materials, which are different from each, form a semiconductor alloy in conjunction. More preferably, the first semiconductor material is silicon, and the second semiconductor material is germanium, which form the silicon germanium alloy.

The semiconductor device of the present invention is preferably a submicron FET device, which has a channel length ranging from about 10 nm to about 100 nm. More preferably, the concentration of the second semiconductor material in the channel region is graded from an initial concentration ranging from about 0 atomic % to about 10 atomic % to a final concentration ranging from about 15 atomic % to about 100 atomic %, or from an initial concentration of from about 15 atomic % to about 100 atomic % to a final concentration of from about 0 atomic % to about 10 atomic %. Further, the gate electrode of the submicron FET device is substantially aligned with the channel region along a direction perpendicular to the surface of the semiconductor device.

The term "substantially aligned" as used herein refers to alignment of two structures or two surfaces along a specific direction, with an offset (i.e., total non-overlapping length) of less than ±20 nm along the specific direction.

In a particularly preferred, but not necessary, embodiment of the present invention, the channel region and at least one of the source and drain regions of the semiconductor device comprise semiconductor material layers that are epitaxially grown along a growth direction that is substantially parallel to the surface of the semiconductor substrate.

Another aspect of the present invention relates to a method for forming a semiconductor device as described hereinabove, comprising:

providing a semiconductor substrate that has a substrate surface;

selectively etching the substrate surface to form a recessed substrate region adjacent to an elevated substrate structure;

epitaxially growing a first semiconductor structure on a sidewall of the elevated substrate structure along a growth direction that is substantially parallel to the substrate surface to fill a portion of the recessed substrate region, wherein the first semiconductor structure comprises a semiconductor alloy comprising a first material and a second, different material, and wherein concentration of the second material is graded in the first semiconductor structure along its growth direction; and epitaxially growing a second semiconductor structure over the first semiconductor structure to fill an additional portion of the recessed substrate region, wherein the first semiconductor structure forms a channel region for a semiconductor device, and wherein the elevated substrate structure and the second semiconductor structure form a source region and a drain region for the semiconductor device.

Yet another aspect of the present invention relates to a field effect transistor (FET) located in a surface of a semiconductor substrate, which comprises a SiGe channel region having a germanium content gradient along a direction substantially parallel to the semiconductor substrate surface.

Other aspects, features and advantages of the invention will be more fully apparent from the ensuing disclosure and appended claims.

DETAILED DESCRIPTION OF THE INVENTION AND PREFERRED EMBODIMENTS THEREOF

Figure 1:
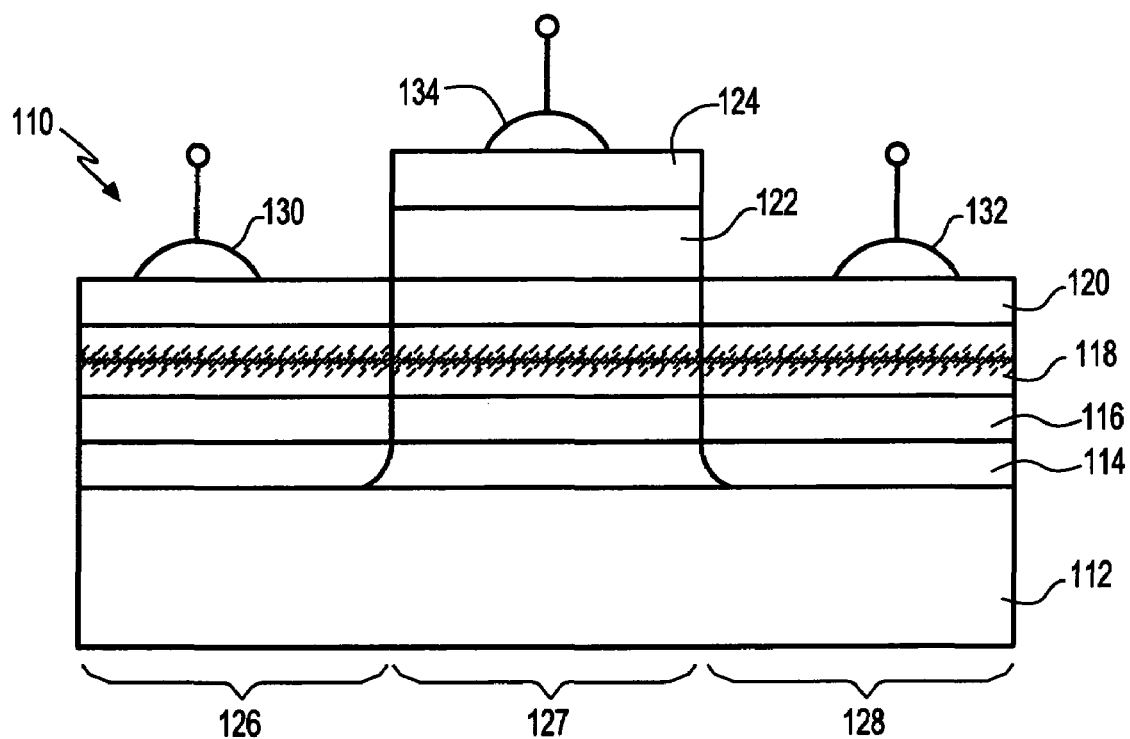
FIG. 1 shows a cross-sectional view of a prior art MOSFET device with a vertically graded SiGe channel region.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

State-of-the-art SiGe heterojunction bipolar transistor (HBT) devices typically employ a SiGe base region having a germanium content gradient, i.e., the germanium content in the base region increases from a low concentration near the emitter-base junction of the HBT to a high concentration deeper into the base region of the HBT. Such a germanium content gradient functions to create a quasi-static drift field with decreasing band-gap along the direction of the electron flow, so that electrons injected from the emitter region of the HBT device face a reduced injection barrier, due to the low germanium concentration at the emitter-base junction, and then experience an accelerating electric field across the base region, due to the increasing germanium content deeper into the base region. The germanium content gradient in the base region therefore has the effect of speeding the transport of electrons across the HBT device, resulting in reduced transit time through the base, which is of particular importance in scaling the device to a higher-speed performance.

It would therefore be advantageous if such a germanium content gradient could be employed in the channel region of an FET device to provide an accelerating electric field across the channel region for speeding the transport of electrons across the channel region of the FET device.

However, incorporation of a desired germanium content gradient into the FET channel region presents challenges that do not exist in the HBT device, due to certain unique structural features of the FET device.

The HBT device typically has vertically arranged base and emitter regions, which define a current flow along the vertical direction, i.e., the direction that is perpendicular to the substrate surface. In order to provide an accelerating electric field for the vertical current flow in the HBT device, a vertical germanium gradient is desired, and it can be readily formed by the existing deposition techniques, by programming the germanium precursor flow in a time-dependent manner. In this manner, and as the SiGe film grows, the germanium content in the SiGe film changes along the SiGe growth direction, i.e., the vertical direction.

Unlike the HBT device, a typical FET device has horizontally arranged source and drain regions, which define a current flow along the lateral direction, i.e., the direction that is parallel to the substrate surface. A lateral germanium gradient is therefore required for providing an accelerating electric field for this lateral current flow. However, existing deposition techniques do not accommodate growth of SiGe films with lateral germanium gradients.

Moreover, a high performance FET device requires precise alignment between the channel and the gate regions, in order to minimize the overlap between the gate region and the source/drain regions. However, the channel length of a submicron FET device is typically very small (e.g., from about 10 nm to about 100 nm). Therefore, even if a laterally graded SiGe channel could be fabricated successfully, precise alignment of the gate structure to the laterally graded SiGe channel poses additional processing challenges.

The present invention provides corresponding solutions to the above-described problems, by forming a high performance FET device with a laterally graded SiGe channel region and a gate structure that is substantially aligned to the SiGe channel region using a sequence of processing steps, which include, but are not limited to: selective etching and selective epitaxial growth.

Exemplary FET devices of the present application, as well as the correspondingly processing steps for forming such devices, will now be illustrated in detail by referring to the accompanying drawings in FIGS. 2-5. Note that these drawings are not drawn to scale. Further, like and/or corresponding elements in these drawings are referred to by like reference numerals. It will also be appreciated that when an element as a layer, region, or substrate is referred to as being "on" another element, it can be directly on the other element, or intervening elements may also be present. In contrast, when an element is referred to as being "directly on" another element, there are no intervening elements present.

Figure 2:
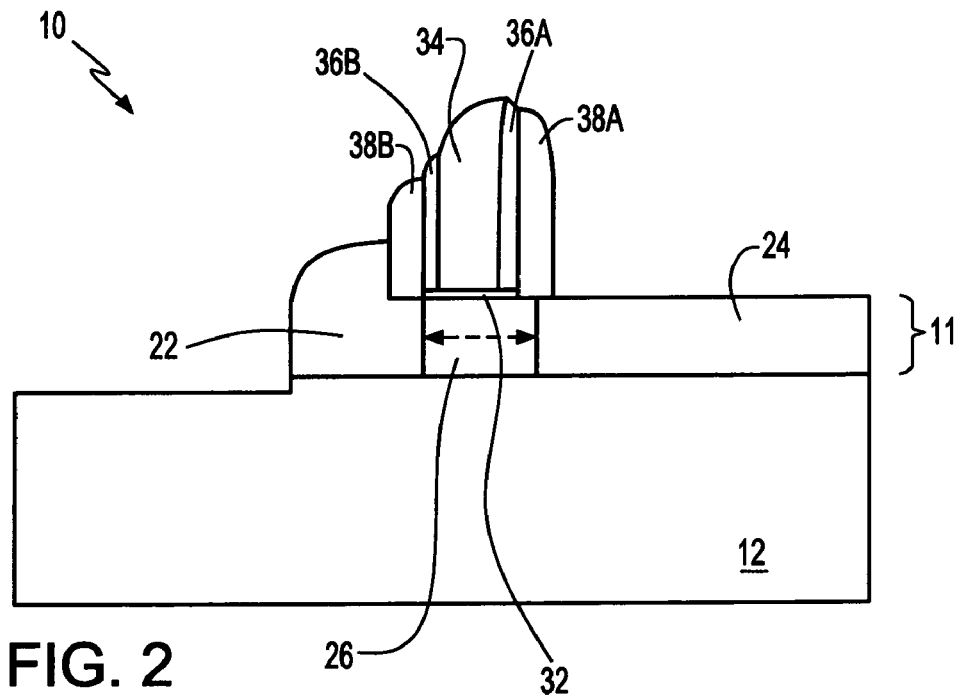
FIG. 2 shows a cross-sectional view of an exemplary MOSFET device formed in a semiconductor-on-insulator substrate and having a laterally graded SiGe channel region that is self-aligned to the gate conductor of the MOSFET, according to one embodiment of the present invention.

Reference is first made to FIG. 2, which shows a cross-sectional view of an MOSFET structure 10 formed in a semiconductor-on-insulator (SOI) substrate that comprises a semiconductor layer 11 over an insulator layer 12, according to one embodiment of the present invention. Note that the insulator layer 12 is typically located on a base semiconductor layer, which is not shown here. Source/drain regions 22, 24 and channel region 26 of the MOSFET structure 10 are located in the semiconductor layer 11, while a gate structure that comprises a gate dielectric layer 32, a gate electrode 34, a first set of sidewall spacers 36A, 36B, and a second set of sidewall spacers 38A, 38B is located over the channel region 26. Note that the sidewall spacers are preferred but not necessary for the MOSFET structure 10.

The insulator layer 12 of the SOI substrate may comprise an oxide, a nitride, an oxynitride, or other suitable insulating material(s). In one embodiment, it is preferred that the insulator layer 12 is comprised of an oxide, such as $SiO_2$, $HfO_2$, $ZrO_2$, $Al_2O_3$, $TiO_2$, $La_2O_3$, $SrTiO_3$, $LaAlO_3$, and mixtures thereof. Further, the insulator layer 12 may comprise a single insulator layer, a multiplicity of insulator layers, or alternating insulator and semiconductor layers having an insulator layer on the top surface. The SOI substrate can be formed by ion implantation, annealing, or a layer transfer process.

The source and drain regions 22 and 24 of the MOSFET structure 10 may be formed of any suitable semiconductor material(s), including, but not limited to: Si, SiC, SiGe, SiGeC, Ge alloys, GaAs, InAs, InP, other III-V or II-VI compound semiconductors, as well as organic semiconductors. The source and drain regions 22 and 24 may comprise a single semiconductor layer, or a multiplicity of semiconductor layers. In some embodiments of the present invention, it is preferred that the source and drain regions 22 and 24 be composed of a Si-containing semiconductor material, i.e., a semiconductor material that includes silicon.

The channel region 26 of the MOSFET structure 10 comprises a semiconductor alloy that contains at least two different materials selected from the group consisting of Si, Ge, C, Ga, As, In, Al, Sb, B, Pb, and combinations thereof, provided that these at least two different materials in conjunction form a semiconductor alloy, which may include, but is not limited to: SiGe, SiC, SiGeC, SiGe:C, GaAsAl, InAsSb, GaAsIn, etc. At least one of the materials in the semiconductor alloy is graded along a lateral direction, i.e., the direction that is substantially parallel to the substrate surface (as indicated by the arrowhead), so as to form an electric field for accelerating the flow of carriers (i.e., electrons or holes) from the source region (one of 22 and 24) to the drain region (the other of 22 and 24) through the channel region 26.

Preferably, but not necessarily, the channel region 26 comprises SiGe alloy with a laterally graded germanium content, and more preferably, the germanium concentration near the drain region (one of 22 and 24) is higher than that near the source region (the other of 22 and 24). Laterally graded SiGe is particularly effective in speeding up the transport of electrons across the channel region 26 and is therefore suitable for forming an n-channel in an n-MOSFET device.

Alternatively, the channel region 26 may comprise Si:C alloy with a laterally graded C content, and more preferably, the C concentration near the drain region (one of 22 and 24) is lower than that near the source region (the other of 22 and 24). The laterally graded C is effective in speeding up the transport of holes across the channel region 26 and is therefore suitable for forming a p-channel in a p-MOSFET device.

The concentration of at least one of the materials in the semiconductor alloy of the channel region 26 is graded from an initial concentration of from about 0 atomic % to about 10 atomic % to a final concentration of from about 15 atomic % to about 100 atomic %, or from an initial concentration of from about 15 atomic % to about 100 atomic % to a final concentration of from about 0 atomic % to about 10 atomic %, depending on the position of the source/drain regions. Preferably, the concentration of the at least one of the materials is graded from an initial concentration of about 5 atomic % to a final concentration of from about 30 atomic %, or from an initial concentration of about 30 atomic % to a final concentration of from about 5 atomic %

Figure 3:
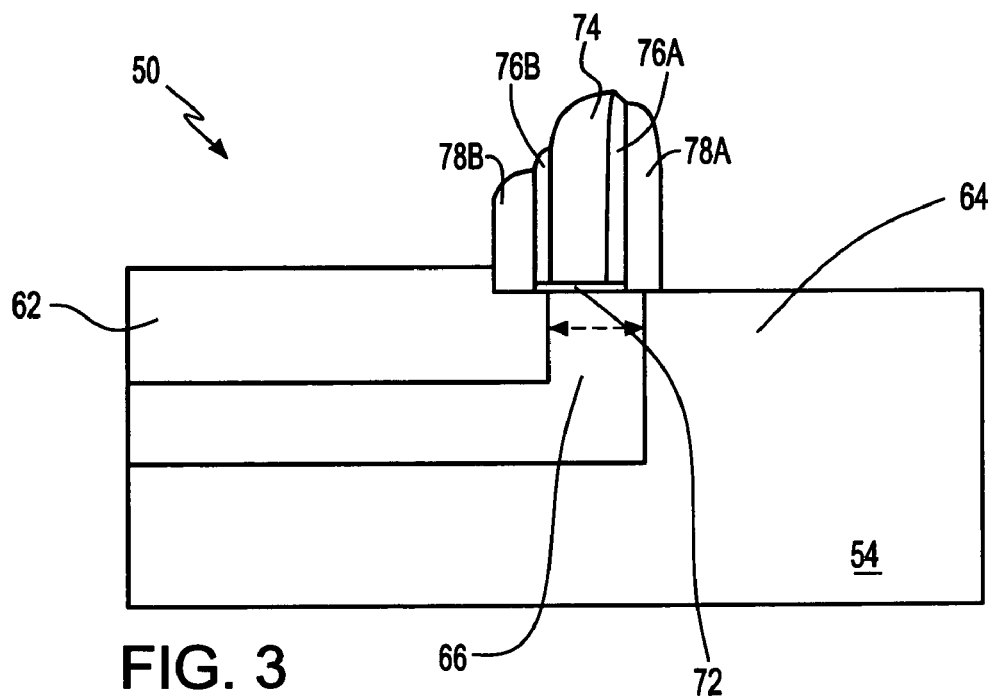
FIG. 3 shows a cross-sectional view of an exemplary MOSFET device formed in a bulk semiconductor substrate and having a laterally graded SiGe channel region that is self-aligned to the gate conductor of the MOSFET, according to one embodiment of the present invention.

FIG. 3 shows a cross-sectional view of an MOSFET structure 50 that is similar to the MOSFET structure 10 shown in FIG. 2, except that MOSFET 50 is formed in a bulk semiconductor substrate 54, instead of a semiconductor-on-insulator substrate. Source/drain regions 62, 64 and channel region 66 of the MOSFET structure 50 are located in the bulk semiconductor substrate 54, while a gate structure that comprises a gate dielectric layer 72, a gate electrode 74, a first set of sidewall spacers 76A, 76B (optional), and a second set of sidewall spacers 78A, 78B (optional) is formed over the channel region 66.

Figure 4A:
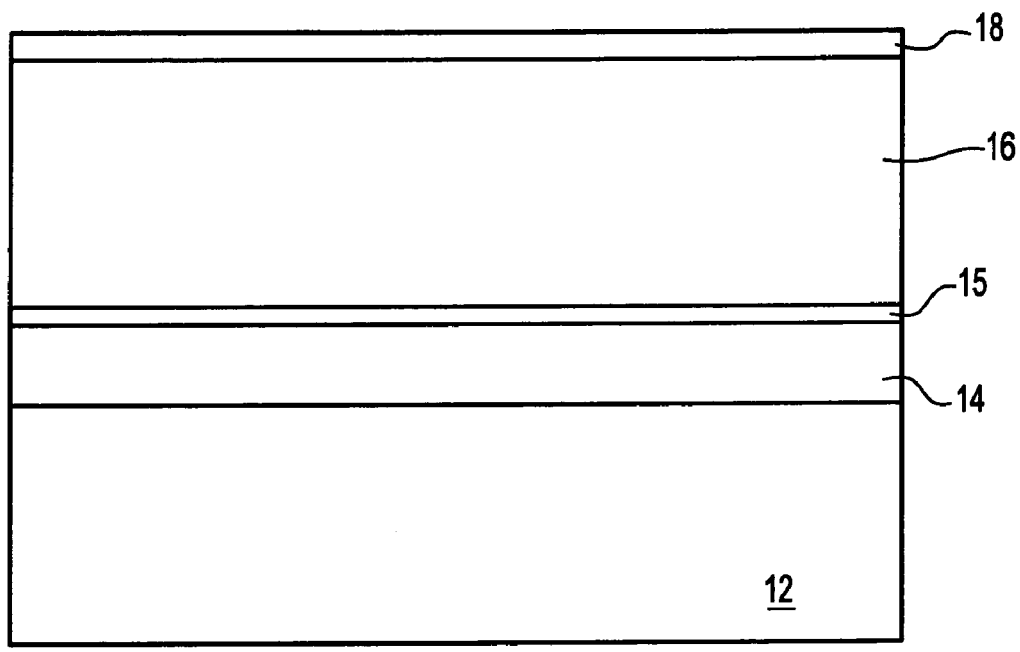
FIGS. 4A-4N illustrate the processing steps for forming the exemplary MOSFET device of FIG. 2, according to one embodiment of the present invention.
Figure 4B:
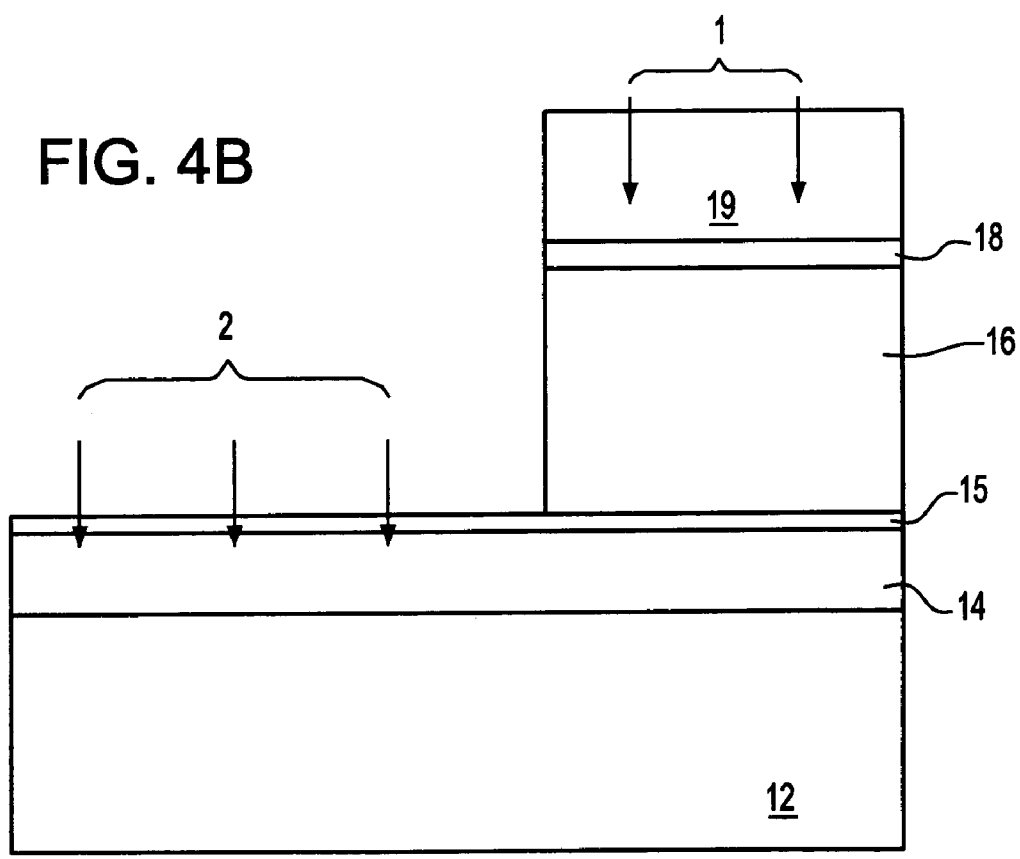
Figure 4C:
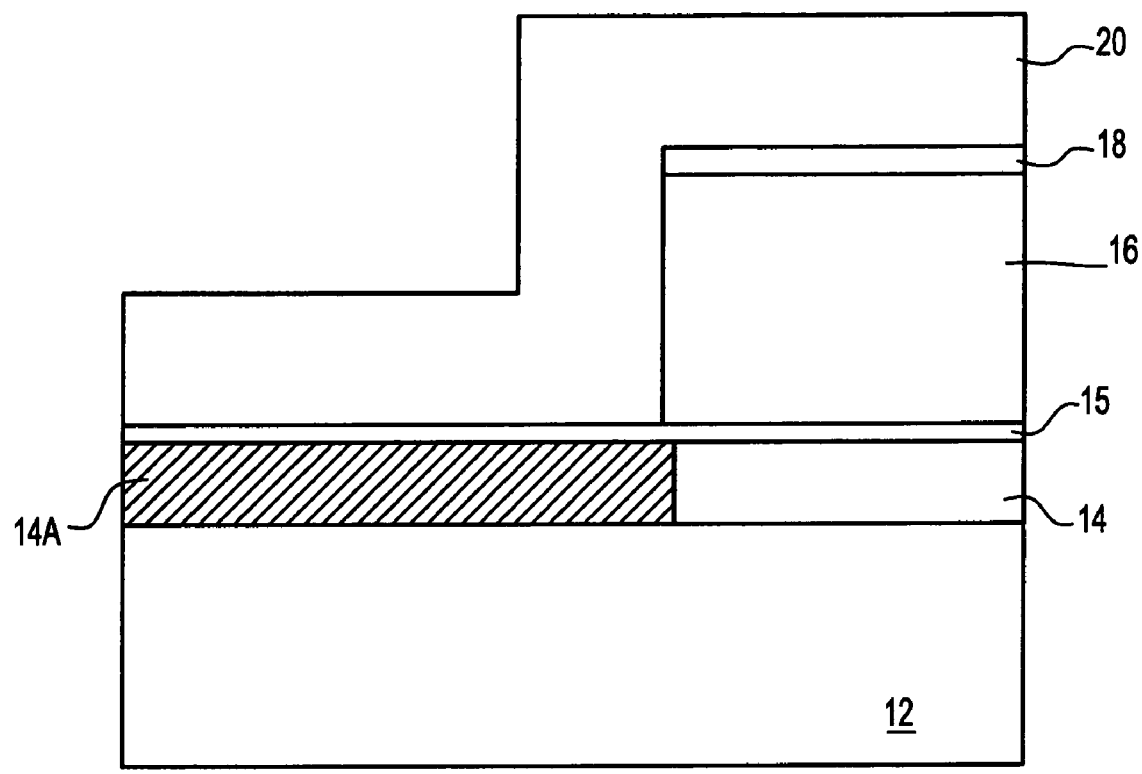
Figure 4D:
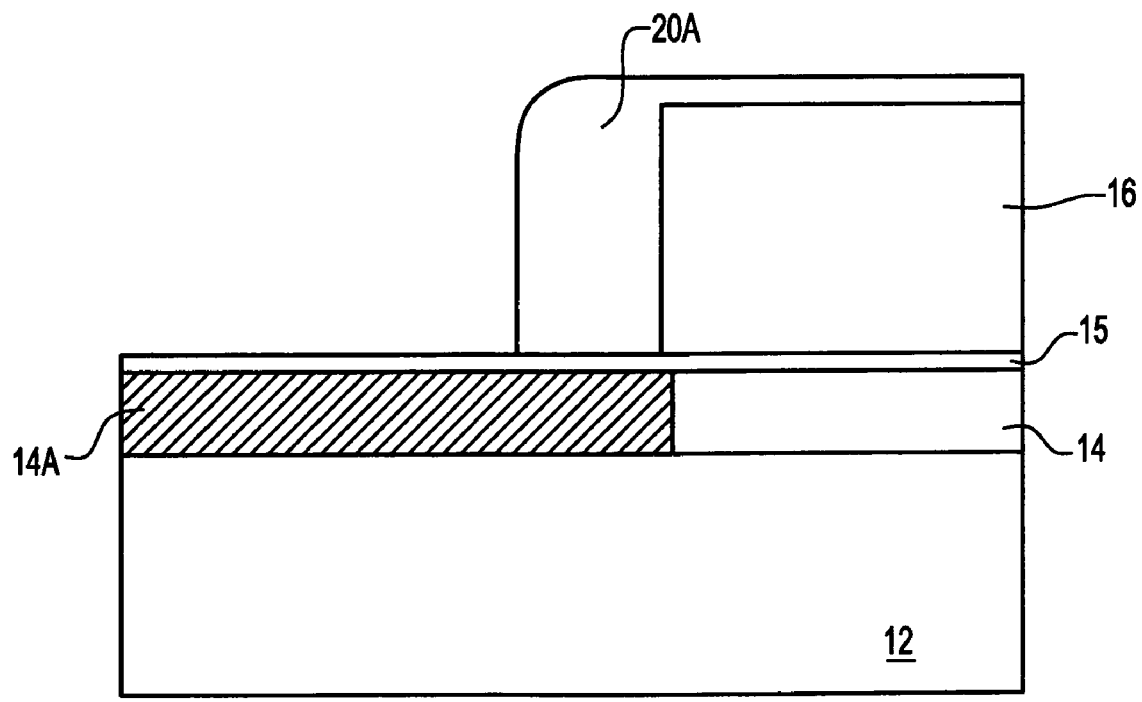
Figure 4E:
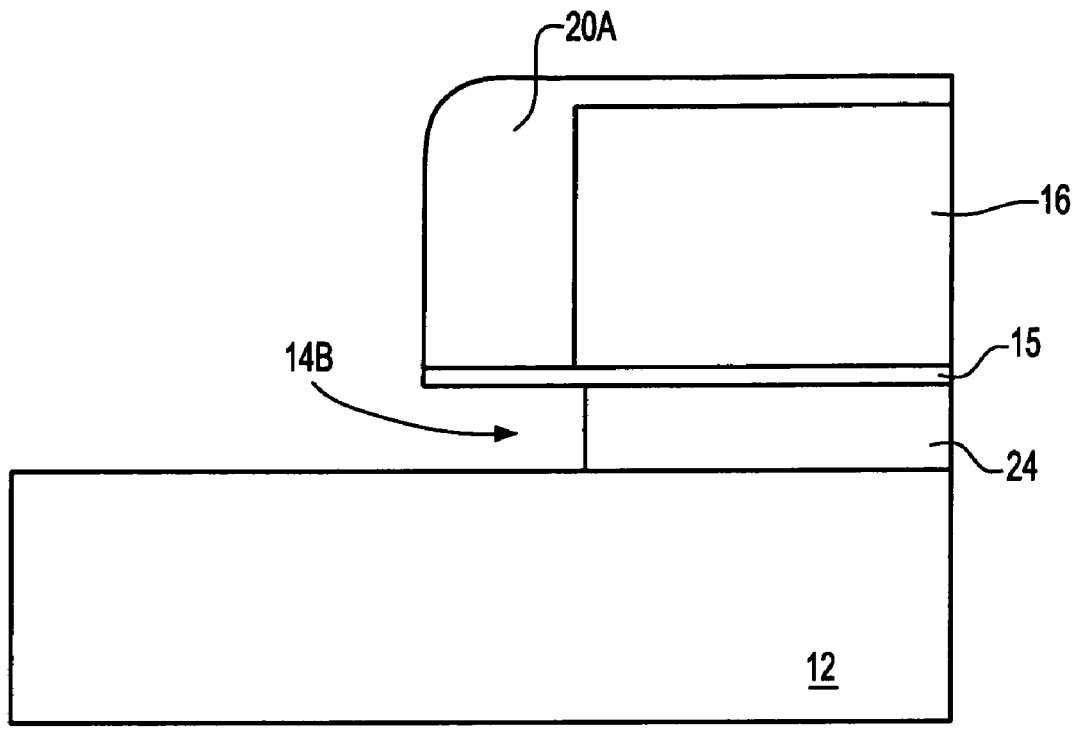
Figure 4F:
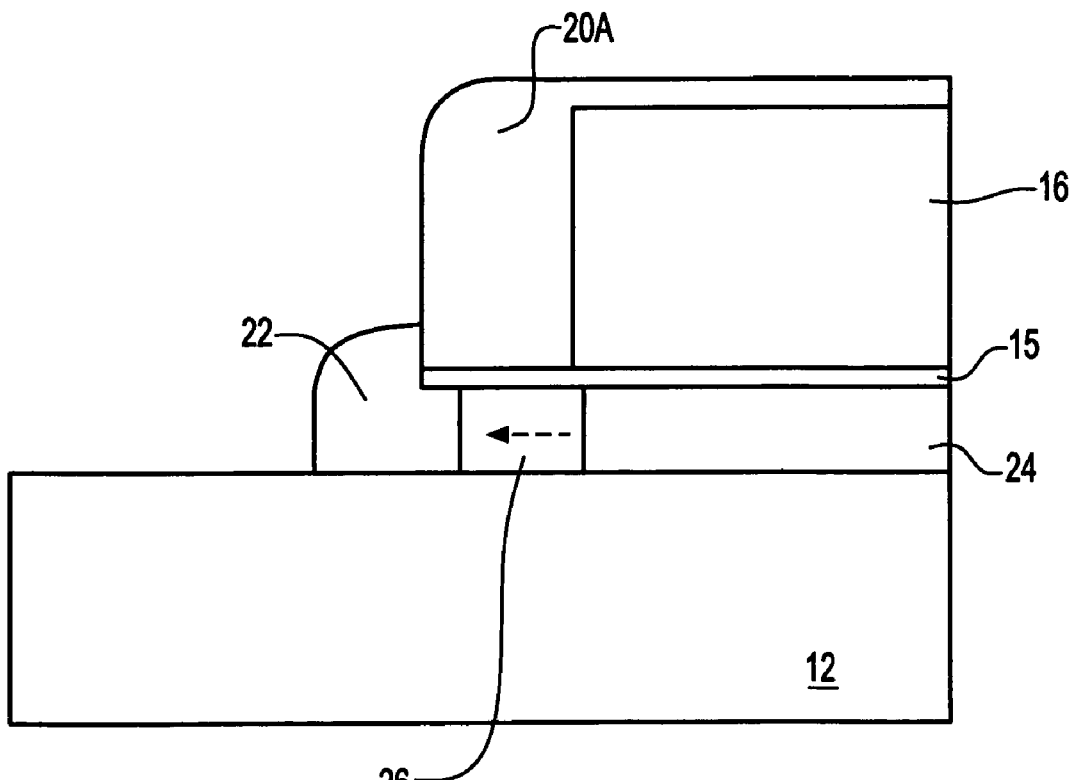
Figure 4G:
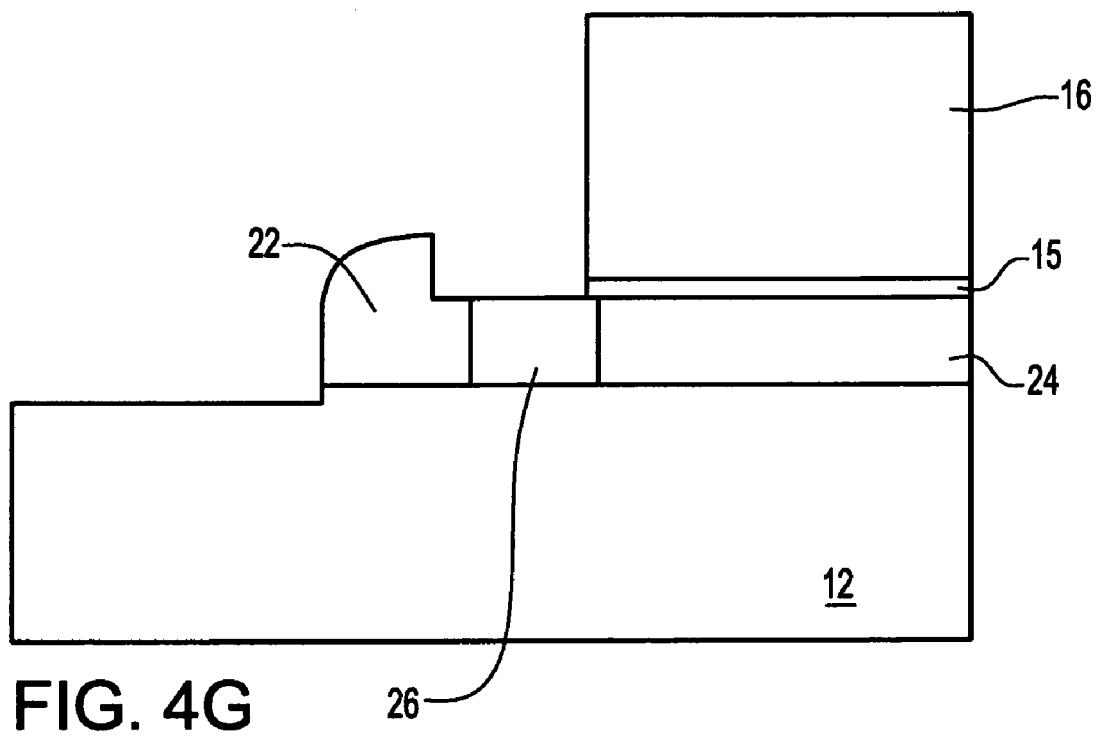
Figure 4H:
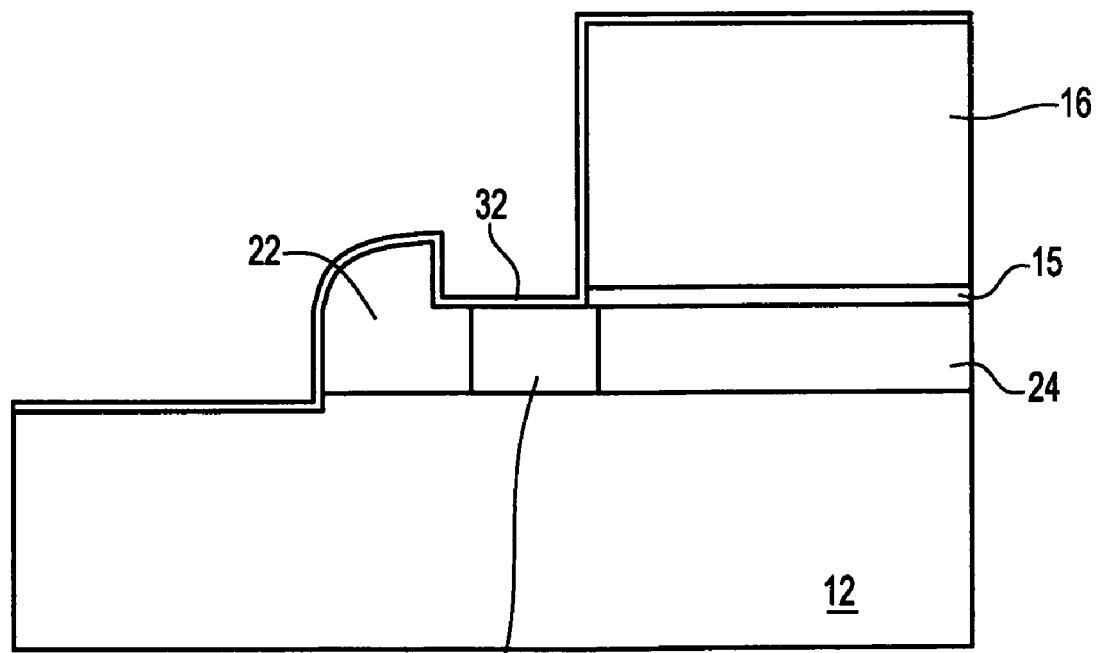
Figure 4I:
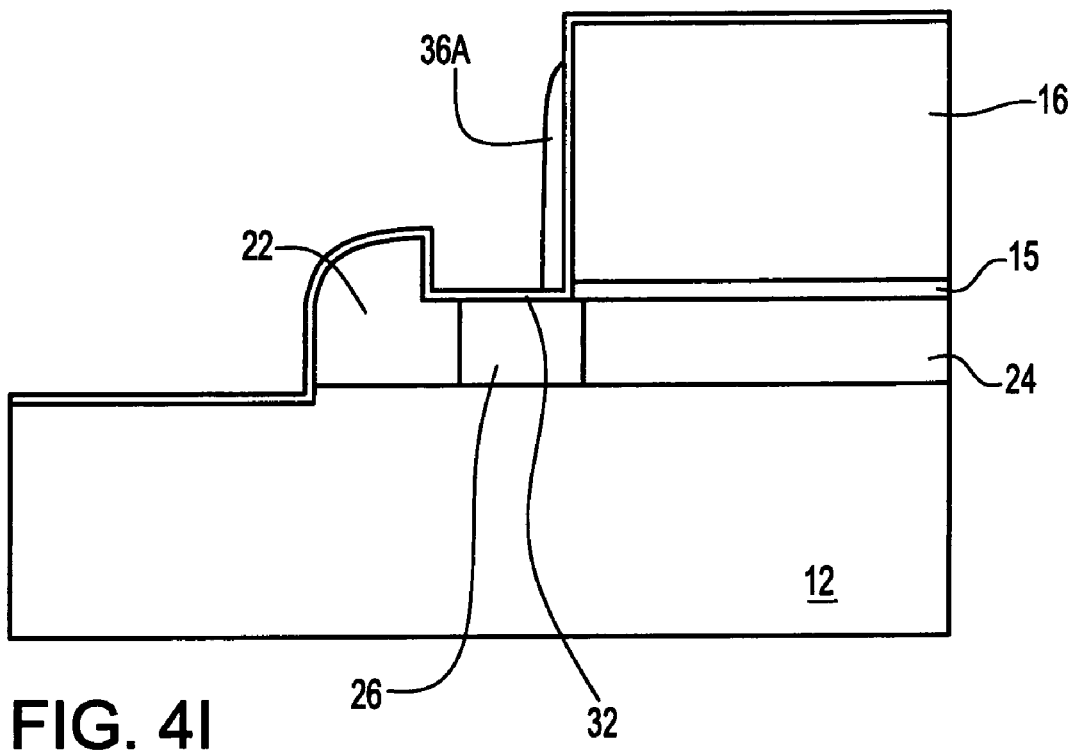
Figure 4J:
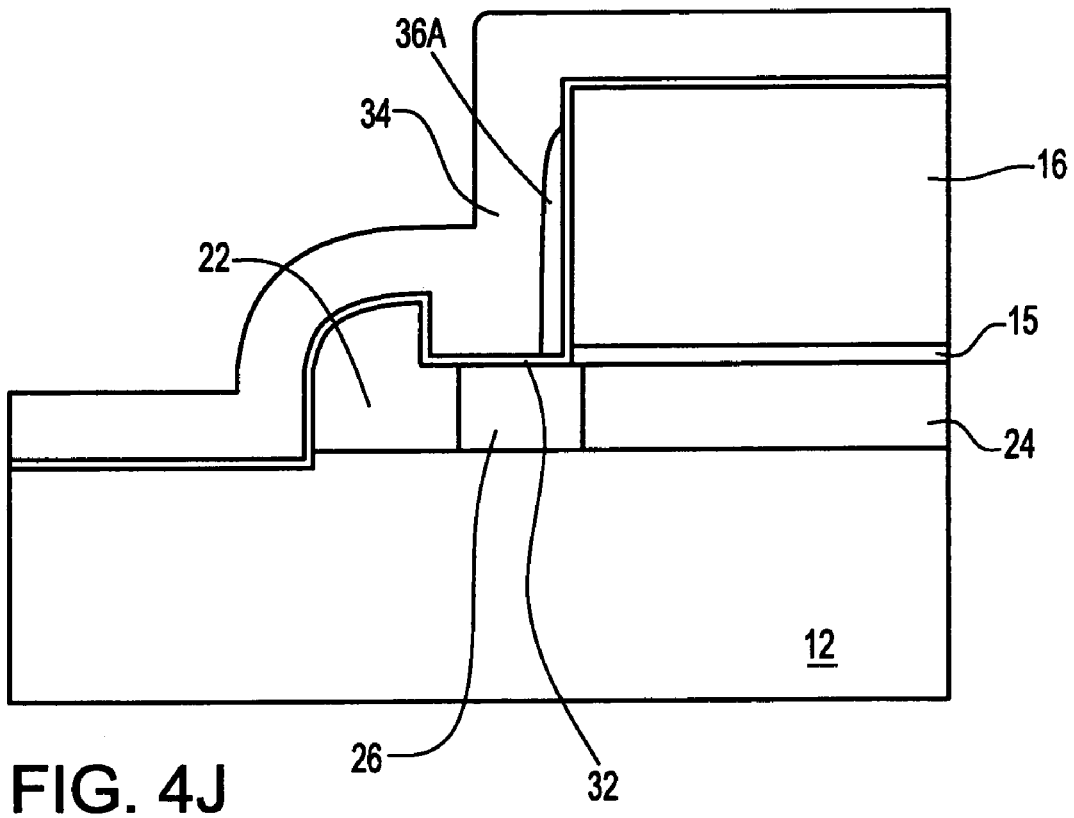
Figure 4K:
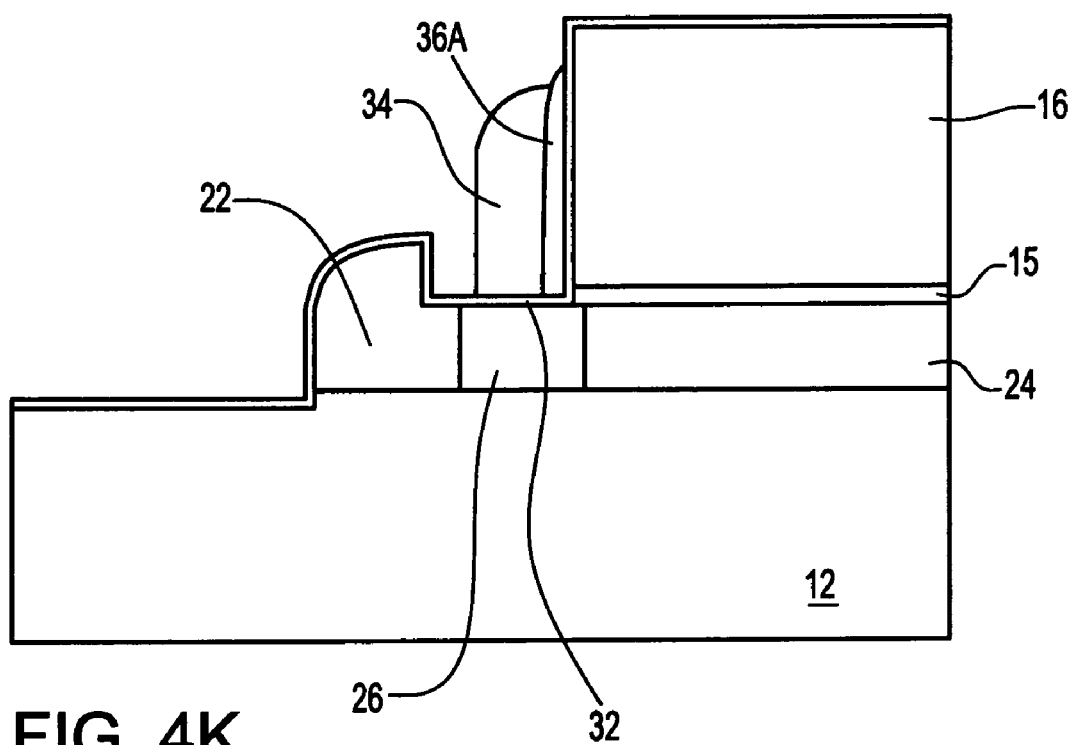
Figure 4L:
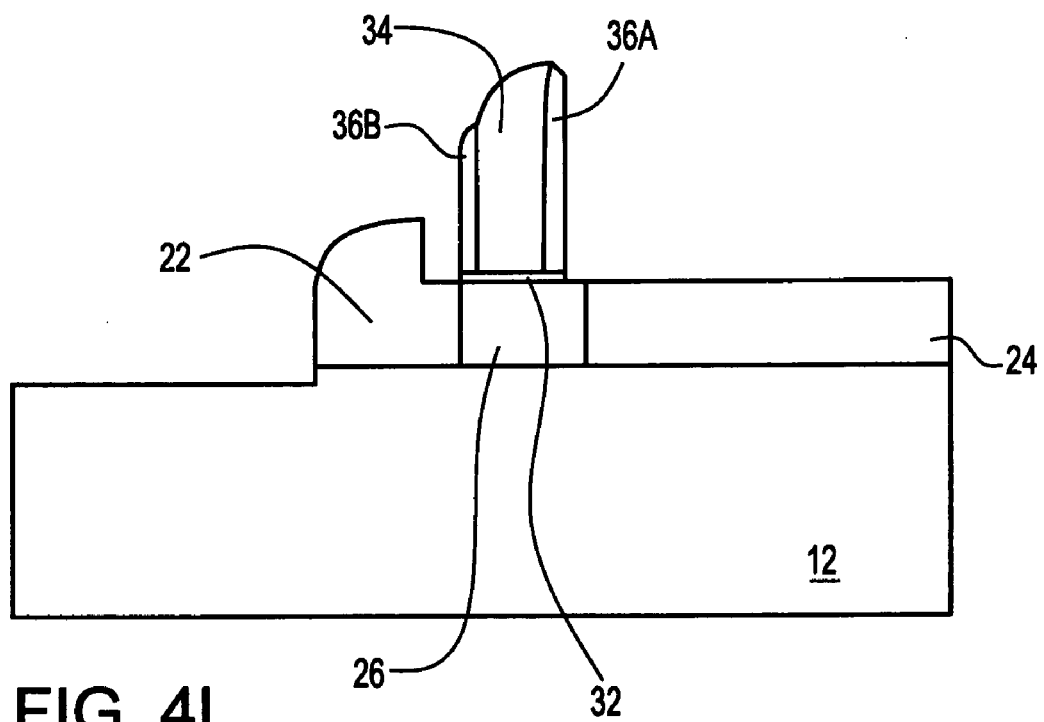
Figure 4M:
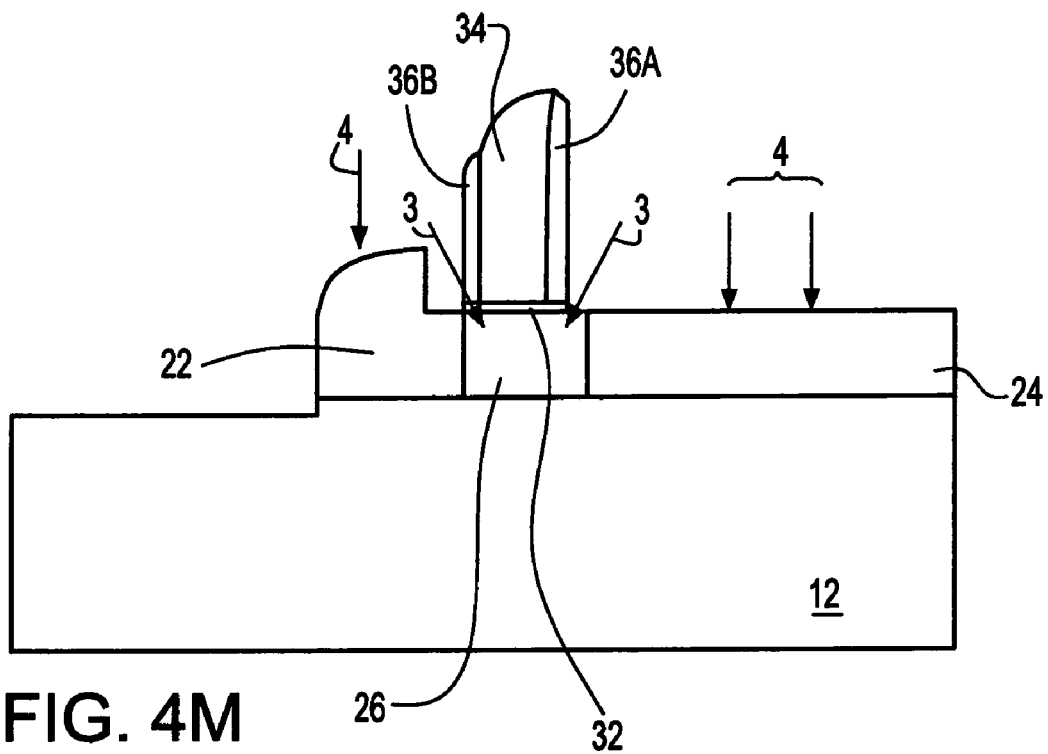
Figure 4N:
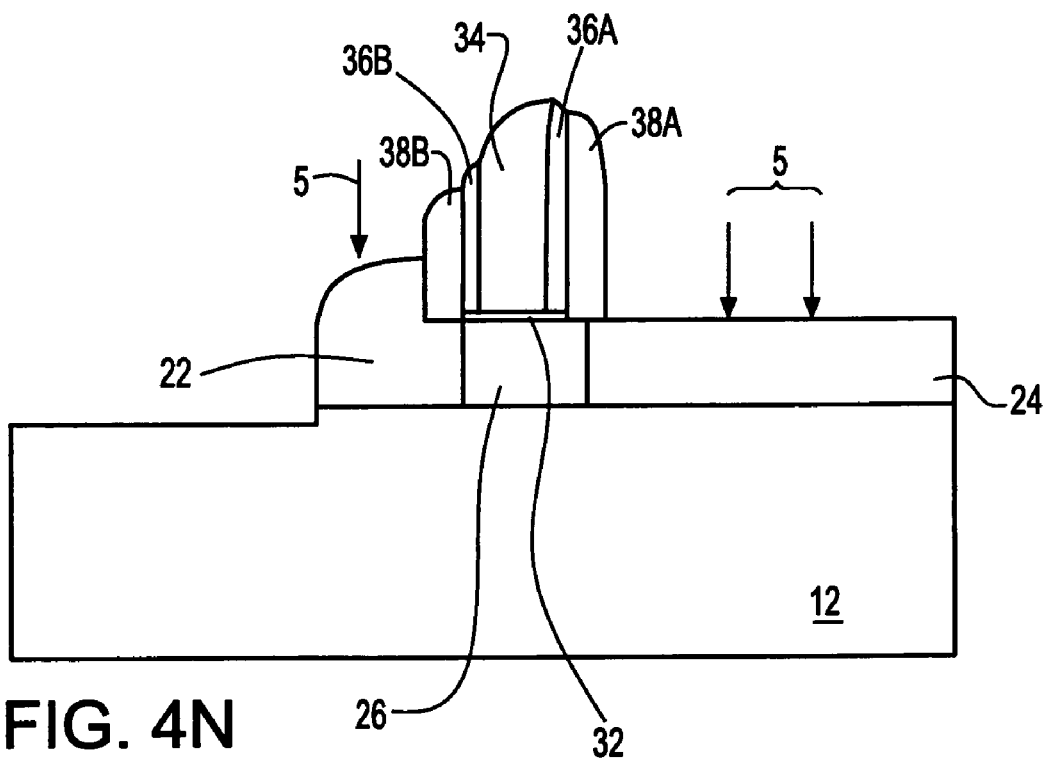

FIGS. 4A-4N show the processing steps for forming the exemplary MOSFET structure 10 of FIG. 2, according to one embodiment of the present invention.

First, as shown in FIG. 4A, a semiconductor-on-insulator (SOI) substrate comprising a semiconductor layer 14 over an insulator layer 12 is provided. An insulator layer 15 and a germanium layer 16 are sequentially formed over the SOI substrate, followed by deposition of a hard mask layer 18.

The semiconductor layer 14 may be formed of any suitable semiconductor material(s), including, but not limited to: Si, SiC, SiGe, SiGeC, Ge alloys, GaAs, InAs, InP, other III-V or II-VI compound semiconductors, as well as organic semiconductors. The semiconductor layer 14 may comprise a single semiconductor layer, or a multiplicity of semiconductor layers. In some embodiments of the present invention, it is preferred that the semiconductor layer 14 be composed of a Si-containing semiconductor material, i.e., a semiconductor material that includes silicon.

The insulator layer 15 may comprise any suitable insulating material(s), including, but not limited to: oxides, nitrides, oxynitrides, etc. In one embodiment, it is preferred that the insulator layer 15 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The insulator layer 15 can be formed by a thermal growing process such as, for example, oxidation, nitridation or oxynitridation. Alternatively, the insulator layer 15 can be formed by a deposition process such as, for example, chemical vapor deposition (CVD), plasma-assisted CVD, atomic layer deposition (ALD), evaporation, reactive sputtering, chemical solution deposition and other like deposition processes. The insulator layer 15 may also be formed utilizing any combination of the above processes. The thickness of the insulator layer 15 may vary, but typically, the insulator layer 15 has a thickness from about 0.5 to about 50 nm, with a thickness from about 5 to about 10 nm being more typical.

The germanium layer 18 can be deposited by utilizing a known deposition process such as, for example, physical vapor deposition, CVD or evaporation. The thickness of the germanium layer 16 in the present invention may vary depending on the deposition process employed. Typically, the germanium layer 16 has a thickness from about 50 to about 500 nm, with a thickness from about 150 to about 200 nm being more typical. Although layer 16, as illustrated herein, is comprised of germanium, according to a preferred embodiment of the present invention, a person ordinarily skilled in the art may recognize that layer 16 can also be formed of any other suitable materials, including but not limited to: n-type doped semiconductor materials, which can be etched away selective to pure semiconductor materials, such as As-doped polysilicon, and P-doped polysilicon.

The hard mask layer 18, which is deposited over the germanium layer 16, may comprise any suitable dielectric masking material for forming patterned masks that allow selective etching of the SOI substrate of FIG. 4A. Preferably, but not necessarily, the hard mask layer 18 comprises silicon nitride.

FIG. 4B shows selective removal of a portion of the germanium layer 16 by lithography and etching so as to expose the insulator layer 15 and the semiconductor layer 14 underneath. The lithography step includes applying a photoresist 19 to the upper surface of the hard mask layer 18, exposing the photoresist 19 to a desired pattern of radiation 1 and developing the exposed photoresist utilizing a conventional resist developer. The pattern in the photoresist is then transferred to the hard mask layer 18 and the germanium layer 16 utilizing one or more dry-etching steps to expose at least a portion of the insulator layer 15 and the semiconductor layer 14 underneath. Suitable dry-etching processes that can be used in the present invention in patterning the hard mask layer 18 and the germanium layer 16 include, but are not limited to: reactive ion etching (RIE), ion beam etching, plasma etching or laser ablation. Ion implantation 2 is subsequently carried out to implant germanium ions into the semiconductor layer 14 underneath the insulator layer 15, using the patterned hard mask layer 18 and germanium layer 16 as implant masks.

The photoresist 19 is removed utilizing a conventional resist stripping process after germanium implantation has been completed, and a heating step is then carried out, for example, at about 800 to about 1200° C. and for about 0.0167 to about 60 minutes, in order to anneal the implantation damages and activate the germanium doping in the semiconductor layer 14, thereby forming a Ge-doped semiconductor layer 14A, as shown in FIG. 4C. Next, a conformal silicon nitride layer 20 is deposited over the entire structure. The conformal silicon nitride layer 20 is then patterned to form nitride spacer 20A, which protects the top surface and the sidewall of the patterned germanium layer 16, while exposing the insulator layer 15 and the Ge-doped semiconductor layer 14A underneath, as shown in FIG. 4D. Patterning of the conformal silicon nitride layer 20 can be readily achieved by utilizing an etching process that selectively removes nitride over the insulator material contained in the insulator layer 15.

Next, as shown in FIG. 4E, additional etching is carried out to selectively remove a portion of the insulator layer 15 and the Ge-doped semiconductor layer 14A. In this manner, the semiconductor layer 14 has been patterned into an elevated semiconductor structure 24, which is adjacent to a recessed region 14B sandwiched between the base insulator layer 12 and the insulator layer 15. The additional etching may be performed utilizing a single etching step or multiple etching steps, including, but not limited to: a dry etching process such as reactive-ion etching, ion beam etching, plasma etching or laser etching, a wet etching process that employs a chemical etchant, or any combination thereof. In a preferred embodiment of the present invention, reactive-ion etching (RIE) is used for the additional etching. Note that etching of the insulator layer 15 is carried out in an anisotropic manner to selectively remove the portion that is not covered by the nitride spacer 20A, while etching of the Ge-doped semiconductor layer 14A is carried out in an isotropic manner so as to remove the entire layer 14A, including the portion underneath the insulator layer 15.

Selective epitaxial growth of silicon germanium is preferably carried out on a sidewall of the elevated semiconductor structure 24, filling the recessed region 14B and forming a silicon germanium layer 26 with a graded germanium concentration on the sidewall of the elevated semiconductor structure 24, as shown in FIG. 4F. The growth direction of the silicon germanium layer 26 is indicated by an arrowhead in FIG. 4F. A corresponding germanium concentration gradient, with either increasing or decreasing germanium content, can be readily provided along this growth direction, by programming the germanium precursor flow in a time-dependent manner during the SiGe deposition process. As the SiGe film grows, the germanium content in the SiGe film changes along the growth direction indicated by the arrowhead.

Thickness of the silicon germanium layer 26 may vary, depending on the specific channel length required by specific applications. Typically, in sub-micron MOSFET devices, the channel length ranges from about 1 nm to about 500 nm, more typically from 10 nm to about 100 nm, and most typically from about 30 nm to about 50 nm. Accordingly, the thickness of the silicon germanium layer 26 falls within the above-listed ranges.

The germanium concentration in the silicon germanium layer 26 can be graded from an initial concentration of from about 0 atomic % to about 10 atomic % to a final concentration of from about 15 atomic % to about 100 atomic %, or from an initial concentration of from about 15 atomic % to about 100 atomic % to a final concentration of from about 0 atomic % to about 10 atomic %, depending on whether the elevated semiconductor structure 24 will be used to form the source region or the drain region of the MOSFET. If the elevated semiconductor structure 24 will be used to form the source region of the MOSFET, the Ge concentration in the silicon germanium layer 26 is preferably graded from a lower initial concentration toward a higher final concentration. On the other hand, if the elevated semiconductor structure 24 will be used to form the drain region of the MOSFET, the Ge concentration in the silicon germanium layer 26 is preferably graded from a higher initial concentration toward a lower final concentration. More preferably, the germanium concentration is graded from an initial concentration of about 5 atomic % to a final concentration of from about 30 atomic %, or from an initial concentration of about 30 atomic % to a final concentration of from about 5 atomic %.

A further selective epitaxial growth is carried out to fill the remaining of the recessed region 14B and form a semiconductor layer 22 over the silicon germanium layer 26, as shown in FIG. 4F. The silicon nitride spacer 20A is then removed by an etching process that selectively removes silicon nitride, followed by selective removal of a portion of the insulator layer 15 by a suitable dry-etching step, such as RIE, in which the germanium layer 16 is used as a mask, as shown in FIG. 4G.

Next, a gate dielectric layer 32 is deposited over the entire structure, as shown in FIG. 4H. The gate dielectric layer 32 may comprise any dielectric material(s), such as, for example, oxides, nitrides, oxynitrides, etc., that have a dielectric constant greater than 4.0, preferably greater than 10, and more preferably greater than 15. In one embodiment of the present invention, the gate dielectric layer 32 comprises $HfO_2$.

FIG. 4I shows formation of a first sidewall spacer 36A along the sidewall of the patterned germanium layer 16 by first depositing a conformal silicon oxide layer (not shown) and then patterning the conformal silicon dioxide layer via one or more etching steps.

A blanket poly-silicon layer 34 is deposited over the entire structure and is subsequently patterned to form a poly-silicon gate electrode 34, as shown in FIGS. 4J and 4K. The blanket poly-silicon layer 34 may be formed by any suitable deposition process such as, for example, physical vapor deposition, CVD or evaporation. The blanket layer of poly-silicon 34 may be doped or undoped. If doped, an in-situ doping deposition process (not shown) may be employed in forming the same. Alternatively, a doped poly-silicon layer can be formed by deposition, ion implantation and annealing. The thickness of the poly-silicon layer 34 may vary, depending on the desired gate length of the MOSFET device, but typically, the poly-silicon layer 34 has a thickness from about 5 to about 100 nm, with a thickness from about 20 to about 50 nm being more typical. Patterning of the poly-silicon layer 34 can be carried out by any suitable etching process, which includes, but is not limited to: a dry etching process such as RIE, plasma etching or laser etching, or a wet etching process wherein a chemical etchant is employed or any combination thereof. In a preferred embodiment of the present invention, reactive-ion etching (RIE) is used for patterning the poly-silicon layer 34.

It is noted that although a poly-silicon gate electrode is shown in the embodiment illustrated by FIGS. 4J and 4K, it is understood that the gate electrode can be formed of any suitable conductive material(s), such as, for example, metals, metal alloys, metal silicides, metal nitrides, and combinations thereof.

A second sidewall spacer 36B is formed along the sidewall of the gate electrode 34, followed by selective removal of a portion of the gate dielectric layer 32, the germanium layer 16, and the insulator layer 15, as shown in FIG. 4L. Any suitable etching process, such as, for example, RIE, plasma etching, laser etching, or a wet etching process in which a chemical etchant is employed, can be used for the selective removal of a portion of the gate dielectric layer 32, the germanium layer 16, and the insulator layer 15. In a preferred embodiment of the present invention, reactive-ion etching (RIE) is used.

FIG. 4M shows formation of source/drain halo regions and source/drain extension regions in the elevated semiconductor structure 24 and the epitaxially grown semiconductor layer 22, by conventional halo and extension implantation processes 3 and 4 using the gate electrode 34 and the sidewall spacers 36A and 36B as masks. Additional sidewall spacers 38A and 38B are then formed by first depositing a conformal silicon nitride layer (not shown), followed by patterning the conformal silicon nitride layer using one or more etching steps. Source/drain implantation 5 is carried out to introduce source and drain dopant species in the elevated semiconductor structure 24 and the epitaxially grown semiconductor layer 22, and a heating step is performed to activate the implanted dopant species and to form the source/drain regions 22 and 24, as shown in FIG. 4N.

After the source/drain regions 22 and 24 are formed, conventional back-end-of-line (BEOL) processing steps, which include, but are not limited to: formation of source/drain/gate metal silicide contacts via self-aligned silicidation steps, deposition of one or more capping layers, and formation of metal interconnects, can be conducted to finish the MOSFET device.

As a result of the above-described processing steps, the MOSFET device 10 as shown in FIG. 2 is formed, which contains a SiGe channel region 26 having a lateral germanium concentration gradient for providing an electric field to accelerate the flow of electrons through the channel region 26. More importantly, the above-described processing steps utilize selective etching and epitaxial film growth, which can be readily controlled at the sub-micron level to achieve precise alignment of the gate electrode 34 with the channel region 26.

Figure 5A:
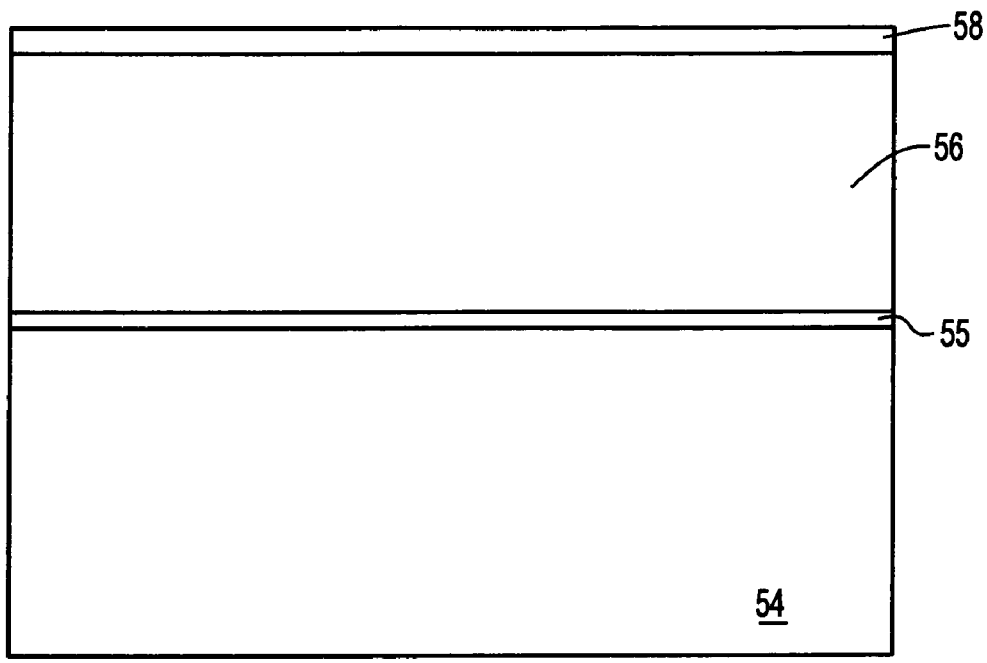
FIGS. 5A-5N illustrates the processing steps for forming the exemplary MOSFET device of FIG. 3, according to one embodiment of the present invention.
Figure 5B:
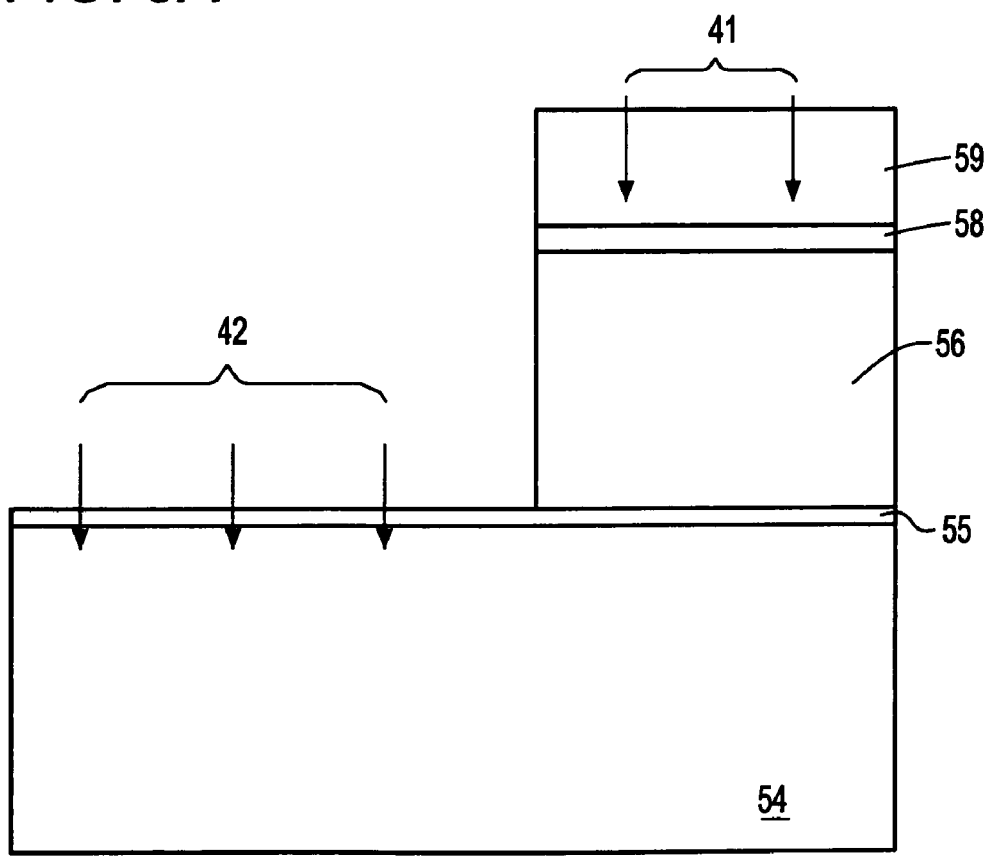
Figure 5C:
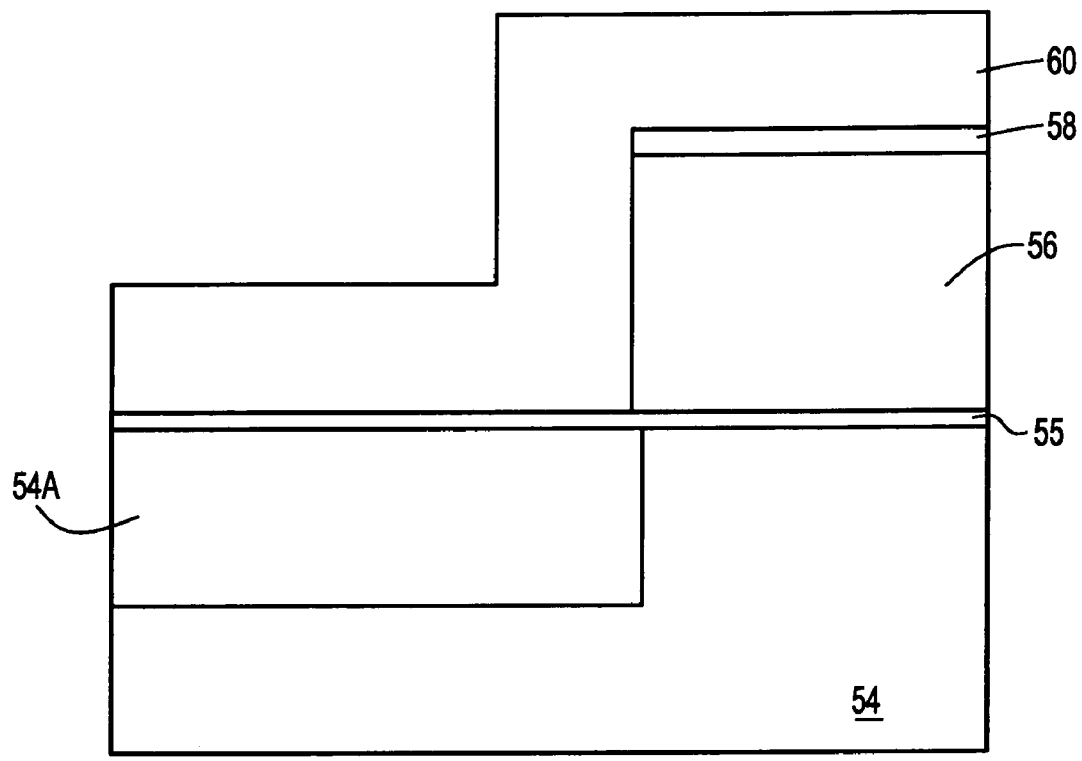
Figure 5D:
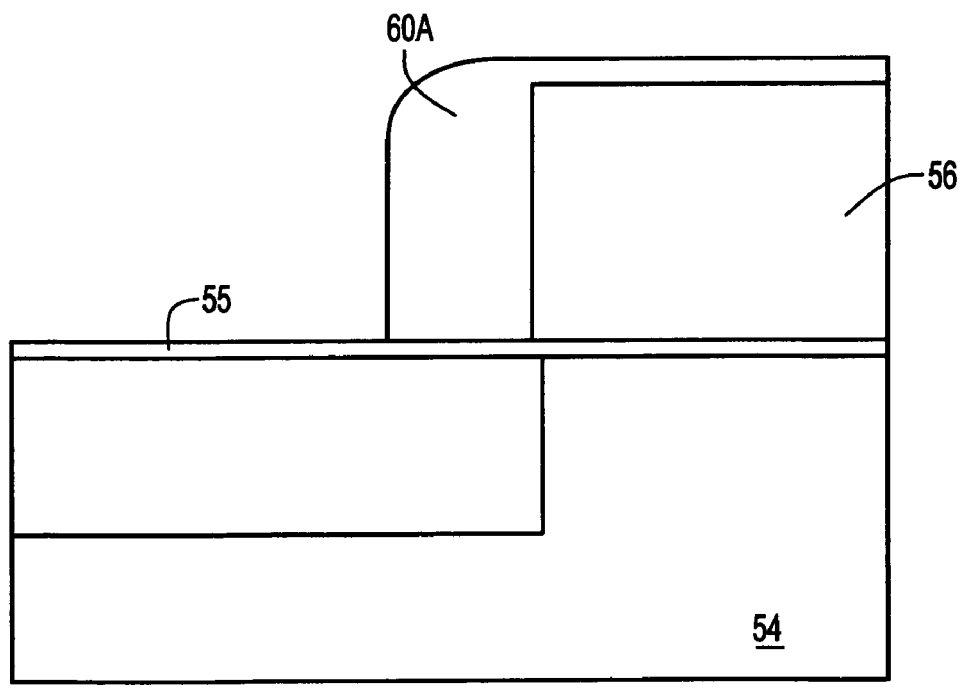
Figure 5E:
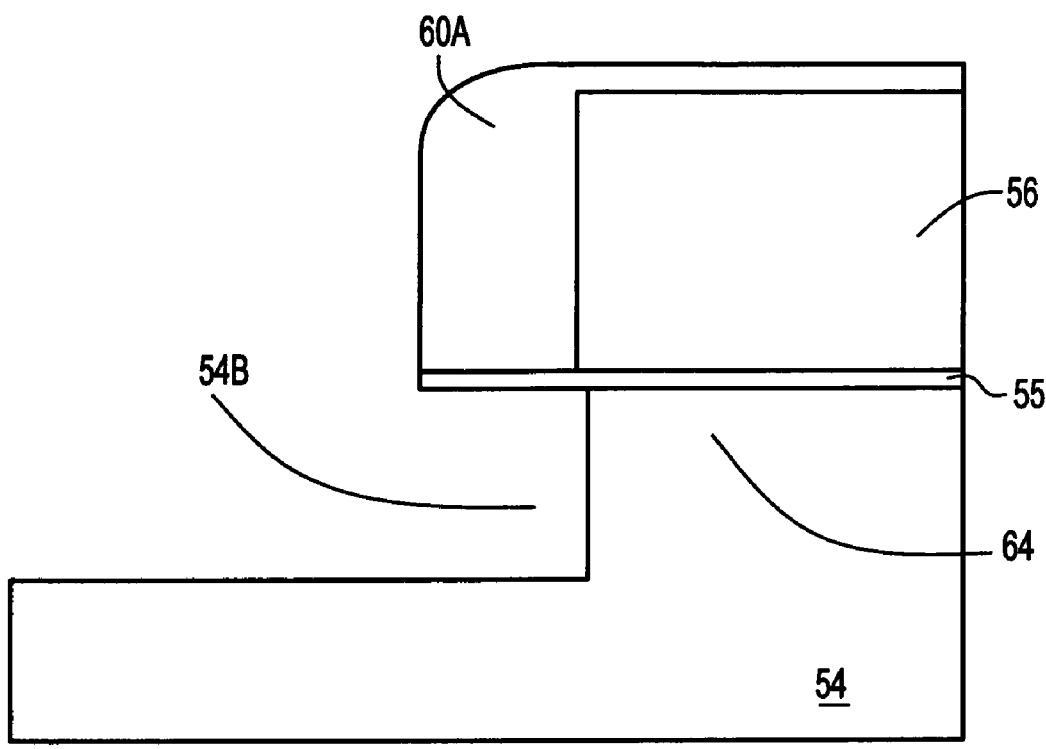
Figure 5F:
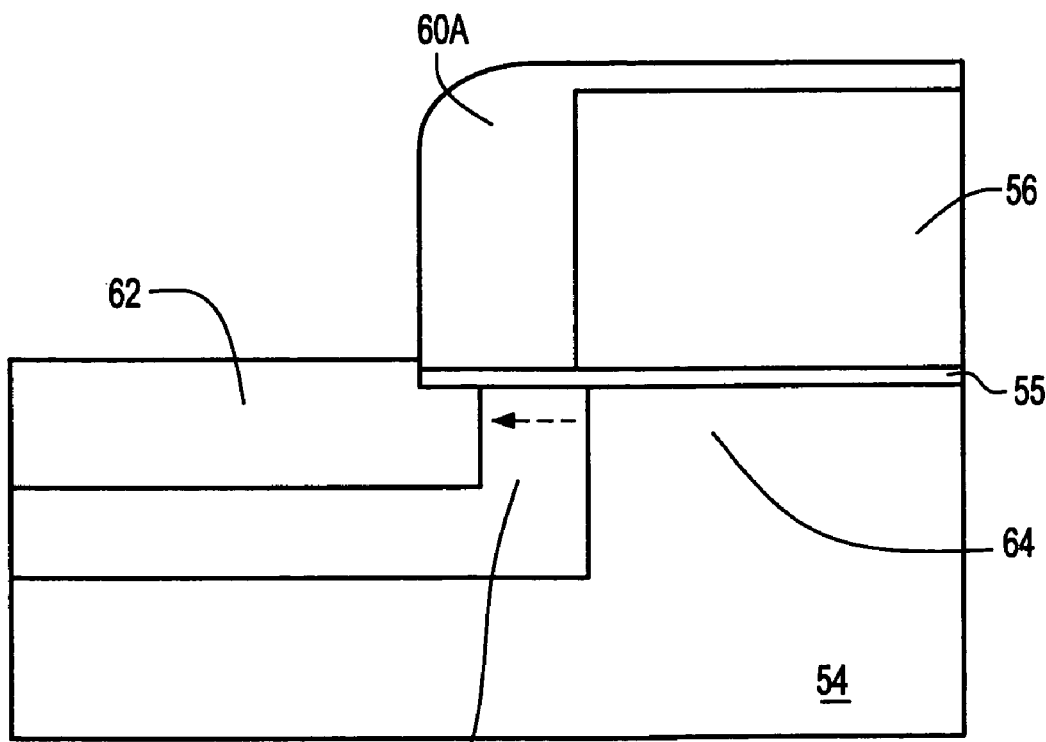
Figure 5G:
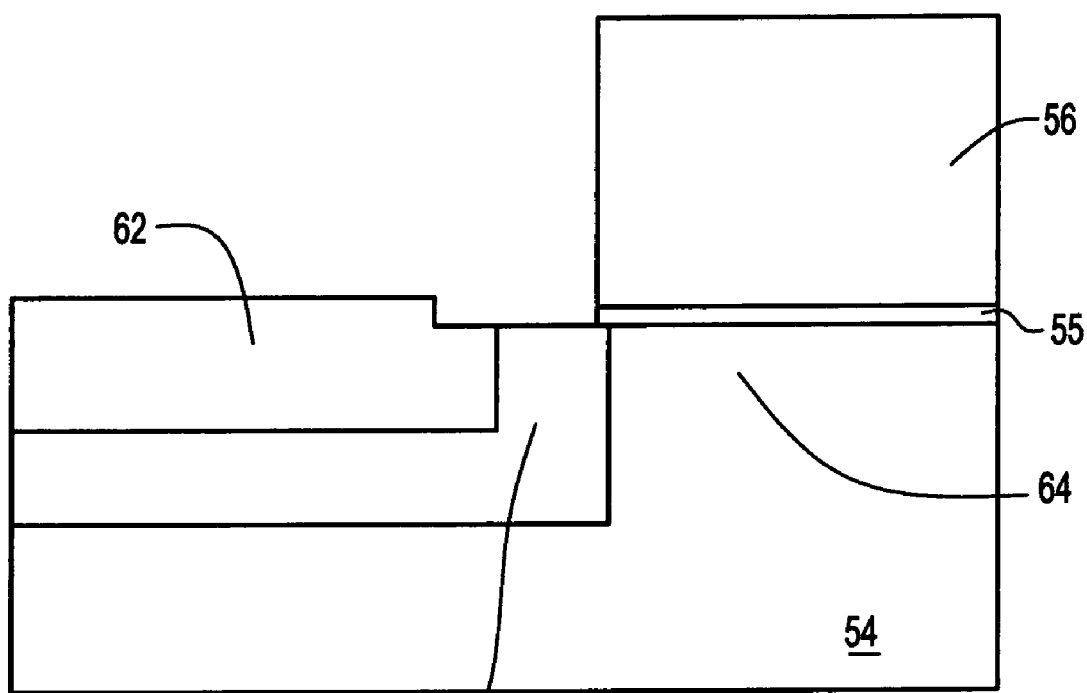
Figure 5H:
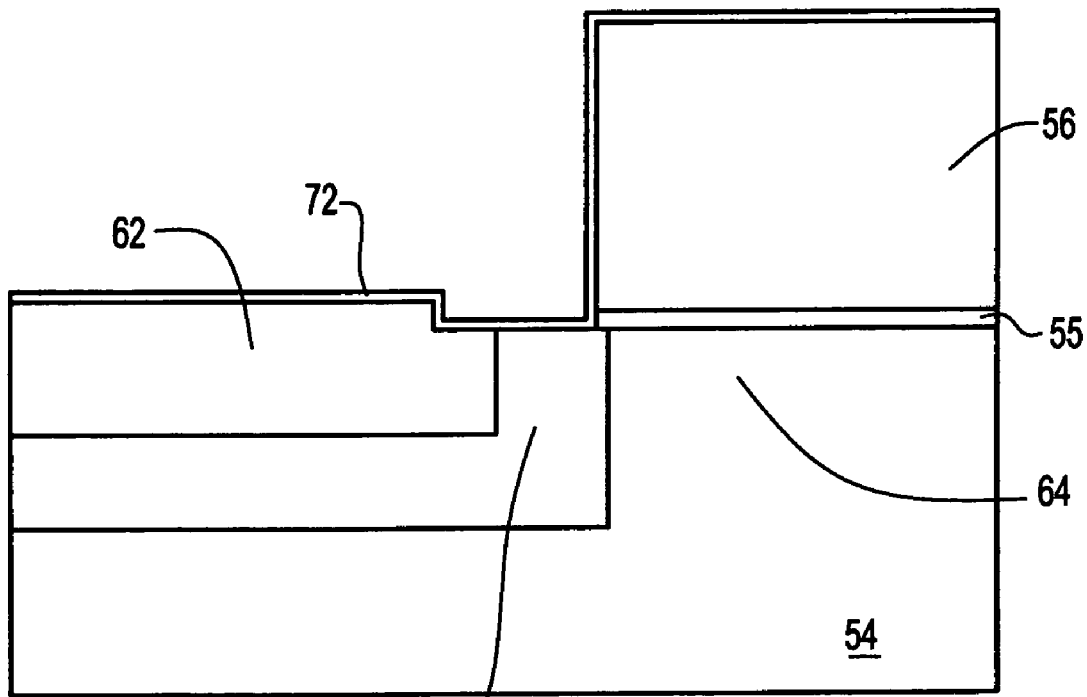
Figure 5I:
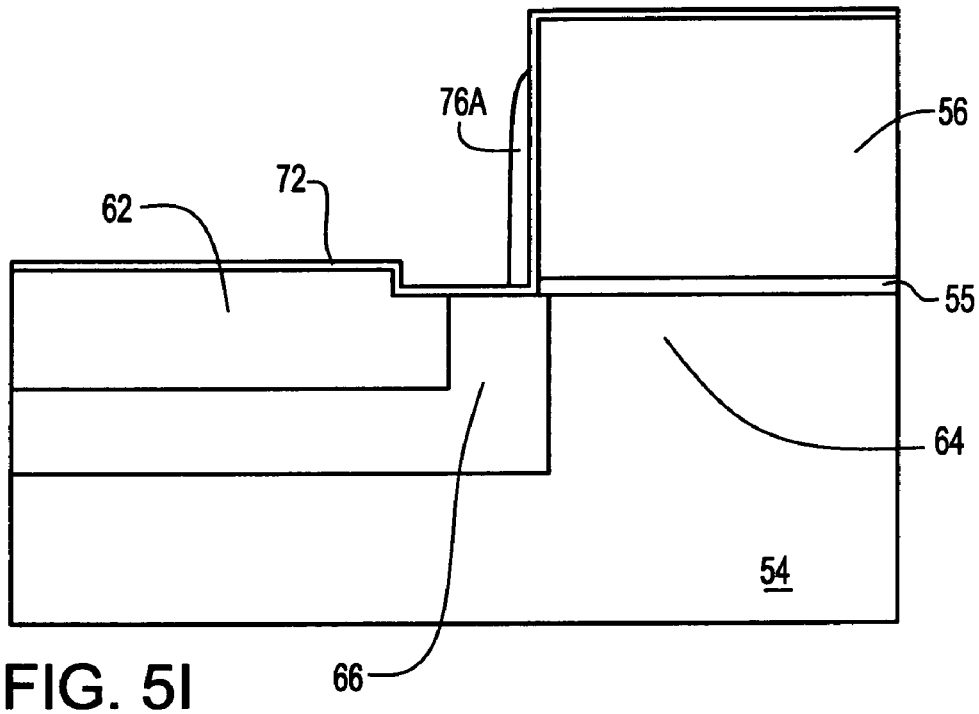
Figure 5J:
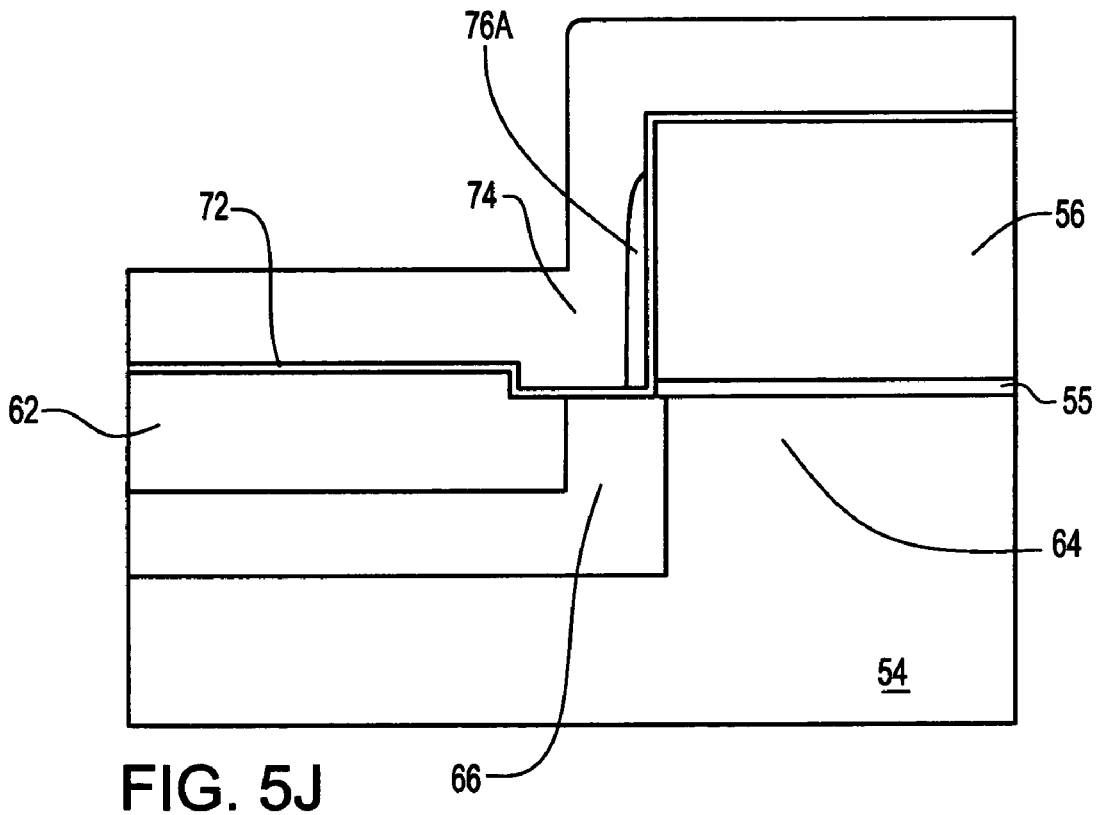
Figure 5K:
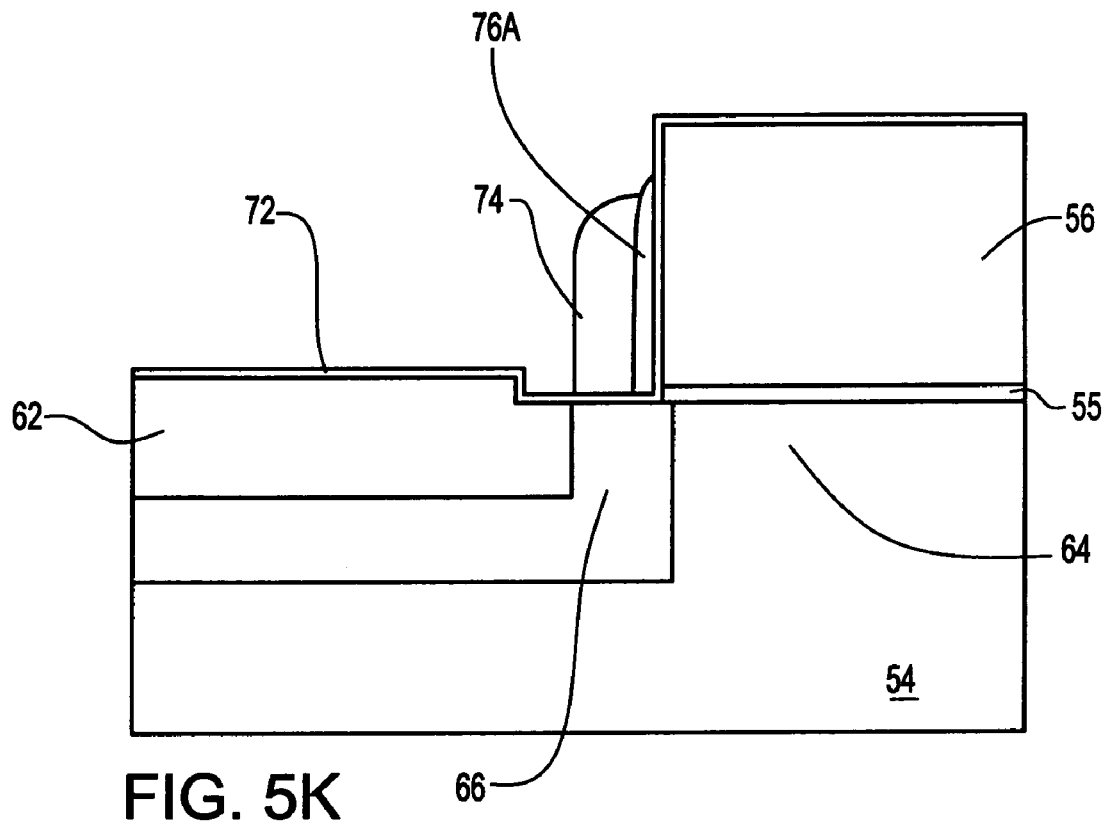
Figure 5L:
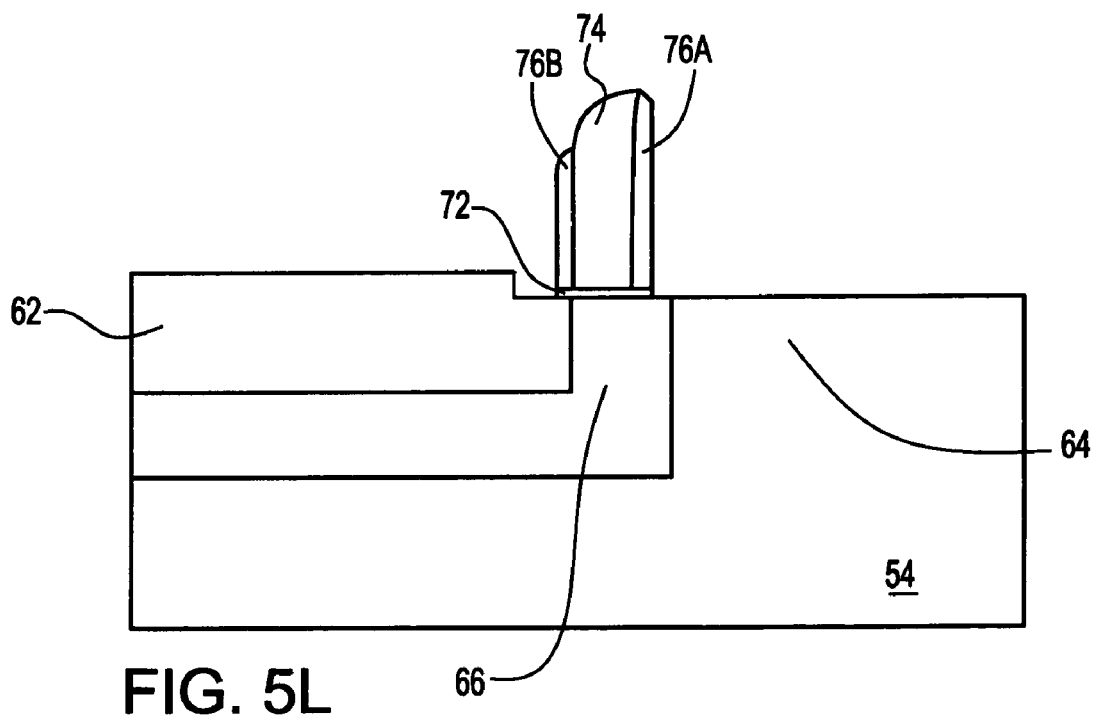
Figure 5M:
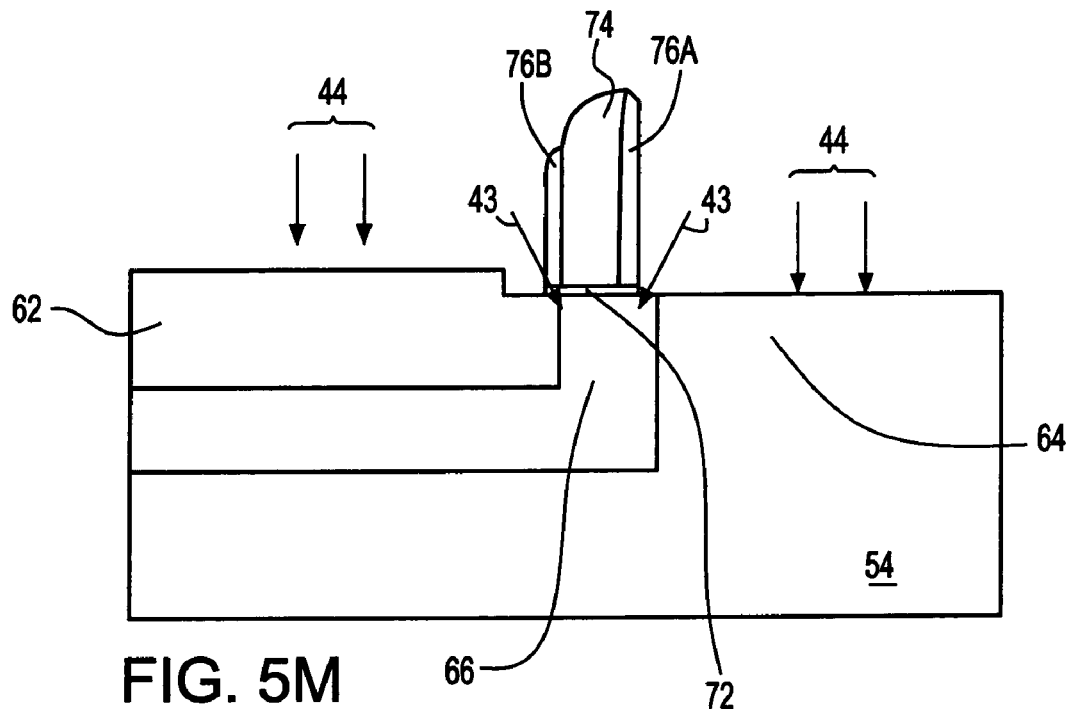
Figure 5N:
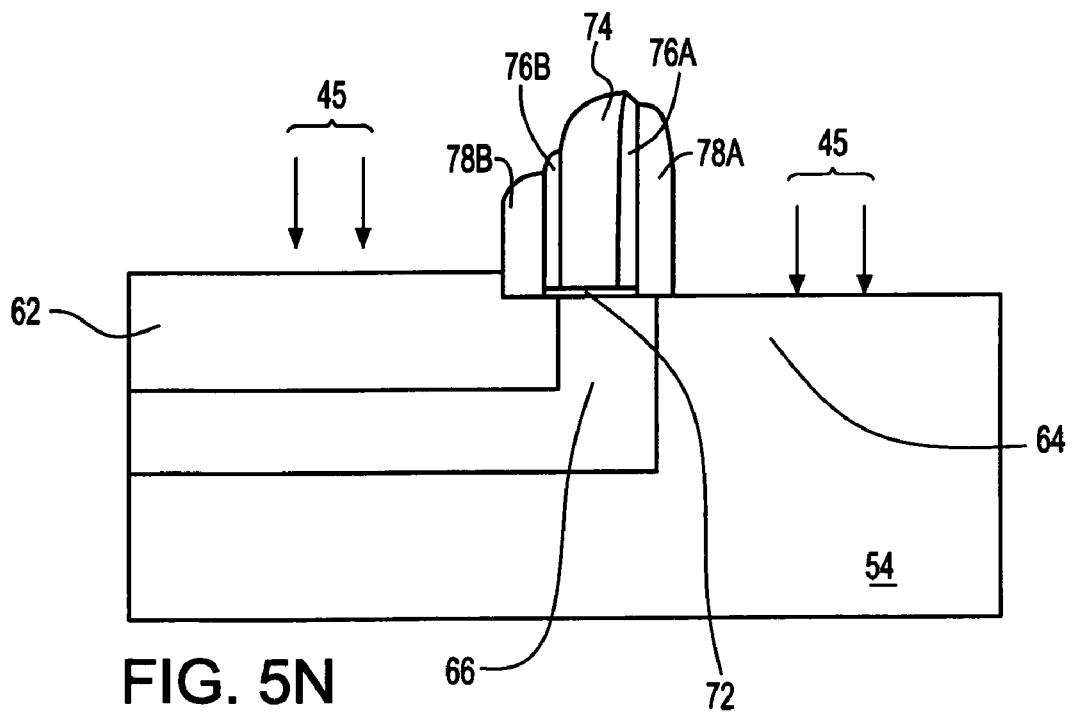

FIGS. 5A-5N correspondingly show the processing steps for forming the exemplary MOSFET structure 50 of FIG. 3, according to one embodiment of the present invention.

First, a bulk semiconductor substrate 54 is provided, over which an insulator layer 55 and a germanium layer 56 are sequentially formed, followed by deposition of a hard mask layer 58, as shown in FIG. 5A.

The bulk semiconductor substrate 54 may be comprise any suitable semiconductor material(s), including, but not limited to: Si, SiC, SiGe, SiGeC, Ge alloys, GaAs, InAs, InP, other III-V or II-VI compound semiconductors, as well as organic semiconductors. Preferably, the bulk semiconductor substrate 54 is composed of a Si-containing semiconductor material, i.e., a semiconductor material that includes silicon.

FIG. 5B shows selective removal of a portion of the germanium layer 56 by lithography and etching so as to expose the insulator layer 55 and the bulk semiconductor substrate 54 underneath. The lithography step includes applying a photoresist 59 to the upper surface of the hard mask layer 58, exposing the photoresist 59 to a desired pattern of radiation 41 and developing the exposed photoresist utilizing a conventional resist developer. The pattern in the photoresist is then transferred to the hard mask layer 58 and the germanium layer 56 utilizing one or more dry-etching steps to expose at least a portion of the insulator layer 55 and the bulk semiconductor substrate 54 underneath. Suitable dry-etching processes that can be used in the present invention in patterning the hard mask layer 58 and the germanium layer 56 include, but are not limited to: reactive ion etching (RIE), ion beam etching, plasma etching or laser ablation. Ion implantation 42 is subsequently carried out to implant germanium ions into a portion of the bulk semiconductor substrate 54 (i.e., the portion not covered by the patterned germanium layer 56) underneath the insulator layer 55.

The photoresist 59 is then removed utilizing a conventional resist stripping process after germanium implantation has been completed, and a heating step is then carried out to anneal the implantation damages and activate the germanium dopant in the bulk semiconductor substrate 54, thereby forming a Ge-doped semiconductor layer 54A, as shown in FIG. 5C. Next, a conformal silicon nitride layer 60 is deposited over the entire structure, which can be patterned to form nitride spacer 50A. As shown in FIG. 5D, the nitride spacer 50A covers the top surface and the sidewall of the patterned germanium layer 56, while exposing the insulator layer 55 and the Ge-doped semiconductor layer 54A underneath.

Next, as shown in FIG. 5E, a portion of the insulator layer 55 and the Ge-doped semiconductor layer 54A is selectively removed by one or more etching steps. In this manner, the bulk semiconductor substrate 54 has been patterned into an elevated semiconductor structure 64, which is adjacent to a recessed region 54B sandwiched between the un-etched portion of the bulk semiconductor substrate 54 and the insulator layer 55.

Selective epitaxial growth of silicon germanium is preferably carried out on a sidewall of the elevated semiconductor structure 64, filling the recessed region 54B and forming a silicon germanium layer 66 with a graded germanium concentration on the sidewall of the elevated semiconductor structure 64, as shown in FIG. 5F. The growth direction of the silicon germanium layer 66 is indicated by an arrowhead in FIG. 4F. A corresponding germanium concentration gradient, with either increasing or decreasing germanium content, can be readily provided along this growth direction, by programming the germanium precursor flow in a time-dependent manner during the SiGe deposition process, as described hereinabove.

A further selective epitaxial growth is carried out to fill the remaining of the recessed region 54B and form a semiconductor layer 62 over the silicon germanium layer 66, as shown in FIG. 5F. The silicon nitride spacer 60A is then removed by an etching process that selectively removes silicon nitride, followed by selective removal of a portion of the insulator layer 55 by a suitable dry-etching step, such as RIE, as shown in FIG. 5G.

Next, a gate dielectric layer 72 is deposited over the entire structure, as shown in FIG. 5H, followed by formation of a first sidewall spacer 76A along the sidewall of the patterned germanium layer 56, as shown in FIG. 5I. The first sidewall spacer 76A is preferably formed by first depositing a conformal silicon oxide layer (not shown) and then patterning the conformal silicon dioxide layer via one or more etching steps.

A blanket poly-silicon layer 74 is deposited over the entire structure and is subsequently patterned to form a poly-silicon gate electrode 74, as shown in FIGS. 5J and 5K. Subsequently, a second sidewall spacer 76B is formed along the sidewall of the gate electrode 74, followed by selective removal of a portion of the gate dielectric layer 72, the germanium layer 56, and the insulator layer 55, as shown in FIG. 5L.

FIG. 5M illustrates formation of source/drain halo regions and source/drain extension regions in the elevated semiconductor structure 64 and the epitaxially grown semiconductor layer 62, by conventional halo and extension implantation processes 43 and 44. Additional sidewall spacers 78A and 78B are then formed by first depositing a conformal silicon nitride layer (not shown), followed by patterning the conformal silicon nitride layer using one or more etching steps. Source/drain implantation 45 is carried out to implant source and drain dopant species into the elevated semiconductor structure 64 and the epitaxially grown semiconductor layer 62, and a heating step is conducted to activate the implanted dopant species, thereby forming the source/drain regions 62 and 64, as shown in FIG. 5N.

After the source/drain regions 62 and 64 are formed, conventional back-end-of-line (BEOL) processing steps are carried out to complete the MOSFET device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a semiconductor device, comprising:
   providing a semiconductor substrate that has a substrate surface;
   selectively etching the substrate surface to form a recessed substrate region adjacent to an elevated substrate structure;
   epitaxially growing a first semiconductor structure over a sidewall of the elevated substrate structure along a growth direction that is substantially parallel to the substrate surface to fill a portion of the recessed substrate region, wherein said first semiconductor structure comprises a semiconductor alloy comprising a first material and a second, material which is different than the first material, and wherein concentration of the second material is graded in said first semiconductor structure along its growth direction; and
   epitaxially growing a second semiconductor structure over the first semiconductor structure to fill an additional portion of the recessed substrate region,
   wherein the first semiconductor structure is used to form a channel region for the semiconductor device,
   wherein the elevated substrate structure and the second semiconductor structure are used to form a source region and a drain region for the semiconductor device, and wherein a gate structure comprising a gate dielectric layer and a gate electrode is formed over the channel region.

2. The method of claim 1, wherein the semiconductor substrate comprises a semiconductor-on-insulator structure.

3. The method of claim 1, wherein the semiconductor substrate comprises a bulk semiconductor structure.

4. The method of claim 1, wherein the first and second materials are selected from the group consisting of Si, Ge, C, Ga, As, In, Al, Sb, B, Pb, and combinations thereof.

5. The method of claim 1, wherein the first material in the first semiconductor structure is silicon, and the second material is germanium.

6. The method of claim 1, wherein the channel region formed by the first semiconductor structure has a channel length ranging from about 10 nm to about 100 nm.

7. The method of claim 6, wherein the concentration of the second material in the channel region is graded from an initial concentration ranging from about 0 atomic % to about 10 atomic % to a final concentration ranging from about 15 atomic % to about 100 atomic %, or from an initial concentration of from about 15 atomic % to about 100 atomic % to a final concentration of from about 0 atomic % to about 10 atomic %.

* * * * *